(12) United States Patent
Takahashi

(10) Patent No.: US 8,943,389 B2
(45) Date of Patent: Jan. 27, 2015

(54) SIGNAL TRANSMISSION/RECEPTION CIRCUIT

(75) Inventor: Tsugio Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 177 days.

(21) Appl. No.: 13/599,490

(22) Filed: Aug. 30, 2012

(65) Prior Publication Data

US 2013/0067296 A1 Mar. 14, 2013

(30) Foreign Application Priority Data

Sep. 14, 2011 (JP) ................. 2011-200790

(51) Int. Cl.
*H03M 13/00* (2006.01)
*H03M 13/05* (2006.01)
*H03M 13/27* (2006.01)
*H03M 13/19* (2006.01)

(52) U.S. Cl.
CPC .......... *H03M 13/05* (2013.01); *H03M 13/2703* (2013.01); *H03M 13/19* (2013.01)
USPC ......................................................... 714/776

(58) Field of Classification Search
CPC . H03M 13/05; H03M 13/2703; H03M 13/19; H04L 1/0009; H04L 1/0014; H04L 47/10; H04L 1/0071; H04L 1/0023
See application file for complete search history.

(56) References Cited

U.S. PATENT DOCUMENTS

| 4,429,390 A * | 1/1984 | Sonoda et al. ................ 714/762 |
| 2007/0198878 A1 * | 8/2007 | Dei ................................ 714/712 |
| 2010/0218074 A1 * | 8/2010 | Fang et al. .................... 714/776 |

FOREIGN PATENT DOCUMENTS

| JP | 62-501047 A | 4/1987 |
| JP | 5-219488 A | 8/1993 |

* cited by examiner

*Primary Examiner* — Guerrier Merant
(74) *Attorney, Agent, or Firm* — Sughrue Mion, PLLC

(57) ABSTRACT

A data buffer section stores input words, and outputs them to a first signal line group in order. An error checking and correcting code is generated that has the same number of bits as the words. Some bits are not to be output at the same time within the range of the first and second signal line groups or within the range of a partial signal line group included in the first and second signal line groups. A code transmission section outputs the error checking and correcting code to different signal lines of the second signal line group respectively, such that a plurality of bits in a code word are not output at the same time within the range of the first and second signal line groups or within the range of a partial signal line group included in the first and second signal line groups.

6 Claims, 25 Drawing Sheets

FIG. 3

| | t1 | t2 | t3 | t4 | t5 | t6 | t7 | t8 | t9 | t10 | |
|---|---|---|---|---|---|---|---|---|---|---|---|
| →TIME | 1-1 | 2-1 | 3-1 | 4-1 | 5-1 | 6-1 | 7-1 | 8-1 | 9-1 | 10-1 | ... |
| | 1-2 | 2-2 | 3-2 | 4-2 | 5-2 | 6-2 | 7-2 | 8-2 | 9-2 | 10-2 | ... |
| | 1-3 | 2-3 | 3-3 | 4-3 | 5-3 | 6-3 | 7-3 | 8-3 | 9-3 | 10-3 | ... |
| | 1-4 | 2-4 | 3-4 | 4-4 | 5-4 | 6-4 | 7-4 | 8-4 | 9-4 | 10-4 | ... |

FIG. 4

| | t5 | t6 | t7 | t8 | t9 | t10 | t11 | t12 | t13 | t14 | t15 | t16 | ... |
|---|---|---|---|---|---|---|---|---|---|---|---|---|---|
| DATA | 1-1 (E1) | 2-1 (E2) | 3-1 (E3) | 4-1 (E4) | 5-1 (E5) | 6-1 (E6) | 7-1 (E7) | 8-1 (E8) | 9-1 (E9) | 10-1 (E10) | 11-1 (E11) | 12-1 (E12) | ... |
| | 1-2 | 2-2 (E1) | 3-2 (E2) | 4-2 (E3) | 5-2 (E4) | 6-2 (E5) | 7-2 (E6) | 8-2 (E7) | 9-2 (E8) | 10-2 (E9) | 11-2 (E10) | 12-2 (E11) | ... |
| | 1-3 | 2-3 | 3-3 (E1) | 4-3 (E2) | 5-3 (E3) | 6-3 (E4) | 7-3 (E5) | 8-3 (E6) | 9-3 (E7) | 10-3 (E8) | 11-3 (E9) | 12-3 (E10) | ... |
| | 1-4 | 2-4 | 3-4 | 4-4 (E1) | 5-4 (E2) | 6-4 (E3) | 7-4 (E4) | 8-4 (E5) | 9-4 (E6) | 10-4 (E7) | 11-4 (E8) | 12-4 (E9) | ... |
| ECC CODE | | | | | E1-1 | E2-1 | E3-1 | E4-1 | E5-1 | E6-1 | E7-1 | E8-1 | ... |
| | | | | | | E1-2 | E2-2 | E3-2 | E4-2 | E5-2 | E6-2 | E7-2 | ... |
| | | | | | | | E1-3 | E2-3 | E3-3 | E4-3 | E5-3 | E6-3 | ... |

→ TIME

FIG. 7

414 FF ARRAY

| $C_{1,1}$ (8) | $C_{1,2}$ (7) | $C_{1,3}$ (6) | $C_{1,4}$ (5) | $C_{1,5}$ (4) | $C_{1,6}$ (3) | $C_{1,7}$ (2) | $C_{1,8}$ (1) |
|---|---|---|---|---|---|---|---|
| $C_{2,1}$ (7) | $C_{2,2}$ (6) | $C_{2,3}$ (5) | $C_{2,4}$ (4) | $C_{2,5}$ (3) | $C_{2,6}$ (2) | $C_{2,7}$ (1) | $C_{2,8}$ (8) |
| $C_{3,1}$ (6) | $C_{3,2}$ (5) | $C_{3,3}$ (4) | $C_{3,4}$ (3) | $C_{3,5}$ (2) | $C_{3,6}$ (1) | $C_{3,7}$ (8) | $C_{3,8}$ (7) |
| $C_{4,1}$ (5) | $C_{4,2}$ (4) | $C_{4,3}$ (3) | $C_{4,4}$ (2) | $C_{4,5}$ (1) | $C_{4,6}$ (8) | $C_{4,7}$ (7) | $C_{4,8}$ (6) |

415 FF ARRAY

| $C_{1,1}$ (4) | $C_{1,2}$ (3) | $C_{1,3}$ (2) | $C_{1,4}$ (1) | $C_{1,5}$ (8) | $C_{1,6}$ (7) | $C_{1,7}$ (6) | $C_{1,8}$ (5) |
|---|---|---|---|---|---|---|---|
| $C_{2,1}$ (3) | $C_{2,2}$ (2) | $C_{2,3}$ (1) | $C_{2,4}$ (8) | $C_{2,5}$ (7) | $C_{2,6}$ (6) | $C_{2,7}$ (5) | $C_{2,8}$ (4) |
| $C_{3,1}$ (2) | $C_{3,2}$ (1) | $C_{3,3}$ (8) | $C_{3,4}$ (7) | $C_{3,5}$ (6) | $C_{3,6}$ (5) | $C_{3,7}$ (4) | $C_{3,8}$ (3) |

FIG. 8

TIME →

| | t9 | t10 | t11 | t12 | t13 | t14 | t15 | t16 | ... |
|---|---|---|---|---|---|---|---|---|---|
| DATA | 1-1 (E1) | 2-1 (E2) | 3-1 (E3) | 4-1 (E4) | 5-1 (E5) | 6-1 (E6) | 7-1 (E7) | 8-1 (E8) | ... |
| | 1-2 (E8) | 2-2 (E1) | 3-2 (E2) | 4-2 (E3) | 5-2 (E4) | 6-2 (E5) | 7-2 (E6) | 8-2 (E7) | ... |
| | 1-3 (E7) | 2-3 (E8) | 3-3 (E1) | 4-3 (E2) | 5-3 (E3) | 6-3 (E4) | 7-3 (E5) | 8-3 (E6) | ... |
| | 1-4 (E6) | 2-4 (E7) | 3-4 (E8) | 4-4 (E1) | 5-4 (E2) | 6-4 (E3) | 7-4 (E4) | 8-4 (E5) | ... |
| ECC CODE | E5-1 | E6-1 | E7-1 | E8-1 | E1-1 | E2-1 | E3-1 | E4-1 | ... |
| | E4-2 | E5-2 | E6-2 | E7-2 | E8-2 | E1-2 | E2-2 | E3-2 | ... |
| | E3-3 | E4-3 | E5-3 | E6-3 | E7-3 | E8-3 | E1-3 | E2-3 | ... |

FIG. 12

| | | t4 | t5 | t6 | t7 | t8 | t9 | |
|---|---|---|---|---|---|---|---|---|
| DATA | BANK A | 1-1 (E1) | 2-1 (E2) | 3-1 (E3) | 4-1 (E4) | 5-1 (E5) | 6-1 (E6) | ... |
| | | 1-2 (E3) | 2-2 (E1) | 3-2 (E2) | 4-2 (E6) | 5-2 (E4) | 6-2 (E5) | ... |
| | BANK B | 1-3 (E1) | 2-3 (E2) | 3-3 (E3) | 4-3 (E4) | 5-3 (E5) | 6-3 (E6) | ... |
| | | 1-4 (E3) | 2-4 (E1) | 3-4 (E2) | 4-4 (E6) | 5-4 (E4) | 6-4 (E5) | ... |
| ECC CODE | BANK C | E1-1 | E2-1 | E3-1 | E4-1 | E5-1 | E6-1 | ... |
| | | E3-2 | E1-2 | E2-2 | E6-2 | E4-2 | E5-2 | ... |
| | | E2-3 | E3-3 | E1-3 | E5-3 | E6-3 | E4-3 | ... |

→ TIME 814-1 FF ARRAY 814-2 FF ARRAY

815 FF ARRAY

FIG. 16

| | | t7 | t8 | t9 | t10 | t11 | t12 | |
|---|---|---|---|---|---|---|---|---|
| DATA | BANK A | 1-1 (E1) | 2-1 (E2) | 3-1 (E3) | 4-1 (E4) | 5-1 (E5) | 6-1 (E6) | ⋮ |
| | | 1-2 (E5) | 2-2 (E6) | 3-2 (E1) | 4-2 (E2) | 5-2 (E3) | 6-2 (E4) | ⋮ |
| | BANK B | 1-3 (E1) | 2-3 (E2) | 3-3 (E3) | 4-3 (E4) | 5-3 (E5) | 6-3 (E6) | ⋮ |
| | | 1-4 (E5) | 2-4 (E6) | 3-4 (E1) | 4-4 (E2) | 5-4 (E3) | 6-4 (E4) | ⋮ |
| ECC CODE | BANK C | E1-1 | E2-1 | E3-1 | E4-1 | E5-1 | E6-1 | ⋮ |
| | | E5-2 | E6-2 | E1-2 | E2-2 | E3-2 | E4-2 | ⋮ |
| | | E3-3 | E4-3 | E5-3 | E6-3 | E1-3 | E2-3 | ⋮ |

⟶ TIME

FIG. 19

1014 FF ARRAY

| $C_{1,1}$ (1) | $C_{1,2}$ (1) | $C_{1,3}$ (1) | $C_{1,4}$ (1) |
|---|---|---|---|
| $C_{2,1}$ (2) | $C_{2,2}$ (2) | $C_{2,3}$ (2) | $C_{2,4}$ (2) |
| $C_{1,1}$ (3) | $C_{1,2}$ (3) | $C_{1,3}$ (3) | $C_{1,4}$ (3) |
| $C_{2,1}$ (4) | $C_{2,2}$ (4) | $C_{2,3}$ (4) | $C_{2,4}$ (4) |

1015 FF ARRAY

| $C_{1,1}$ (4) | $C_{1,2}$ (3) | $C_{1,3}$ (2) | $C_{1,4}$ (1) |
|---|---|---|---|
| $C_{2,1}$ (3) | $C_{2,2}$ (2) | $C_{2,3}$ (1) | $C_{2,4}$ (4) |
| $C_{3,1}$ (2) | $C_{3,2}$ (1) | $C_{3,3}$ (4) | $C_{3,4}$ (3) |

FIG. 20

| | 1-1<br>(E1) | 2-1<br>(E1) | 3-1<br>(E1) | 4-1<br>(E1) | ... |
|---|---|---|---|---|---|
| DATA | 1-2<br>(E2) | 2-2<br>(E2) | 3-2<br>(E2) | 4-2<br>(E2) | ... |
| | 1-3<br>(E3) | 2-3<br>(E3) | 3-3<br>(E3) | 4-3<br>(E3) | ... |
| | 1-4<br>(E4) | 2-4<br>(E4) | 3-4<br>(E4) | 4-4<br>(E4) | ... |
| | E1-1 | E2-1 | E3-1 | E4-1 | ... |
| ECC<br>CODE | E4-2 | E1-2 | E2-2 | E3-2 | ... |
| | E3-3 | E4-3 | E1-3 | E2-3 | ... |

FIG. 24

| | | | | | | | ... |
|---|---|---|---|---|---|---|---|
| 1-1 (E1) | 2-1 (E2) | 3-1 (E3) | 4-1 (E4) | 5-1 (E5) | 6-1 (E6) | 7-1 (E7) | ... |
| 1-2 (E1) | 2-2 (E2) | 3-2 (E3) | 4-2 (E4) | 5-2 (E5) | 6-2 (E6) | 7-2 (E7) | ... |
| 1-3 (E1) | 2-3 (E2) | 3-3 (E3) | 4-3 (E4) | 5-3 (E5) | 6-3 (E6) | 7-3 (E7) | ... |
| 1-4 (E1) | 2-4 (E2) | 3-4 (E3) | 4-4 (E4) | 5-4 (E5) | 6-4 (E6) | 7-4 (E7) | ... |
| E1-1 | E2-1 | E3-1 | E4-1 | E5-1 | E6-1 | E7-1 | ... |
| E1-2 | E2-2 | E3-2 | E4-2 | E5-2 | E6-2 | E7-2 | ... |
| E1-3 | E2-3 | E3-3 | E4-3 | E5-3 | E6-3 | E7-3 | ... |
| DATA | DATA | DATA | DATA | ECC CODE | ECC CODE | ECC CODE | |

TIME →

FIG. 25

| TIME → | | | | | | | |
|---|---|---|---|---|---|---|---|
| DATA | 1-1 (E1) | 1-2 (E1) | 1-3 (E1) | 1-4 (E1) | E1-1 | E1-2 | E1-3 | ... |
| | 2-1 (E2) | 2-2 (E2) | 2-3 (E2) | 2-4 (E2) | E2-1 | E2-2 | E2-3 | ... |
| | 3-1 (E3) | 3-2 (E3) | 3-3 (E3) | 3-4 (E3) | E3-1 | E3-2 | E3-3 | ... |
| | 4-1 (E4) | 4-2 (E4) | 4-3 (E4) | 4-4 (E4) | E4-1 | E4-2 | E4-3 | ... |
| ECC CODE | 5-1 (E5) | 5-2 (E5) | 5-3 (E5) | 5-4 (E5) | E5-1 | E5-2 | E5-3 | ... |
| | 6-1 (E6) | 6-2 (E6) | 6-3 (E6) | 6-4 (E6) | E6-1 | E6-2 | E6-3 | ... |
| | 7-1 (E7) | 7-2 (E7) | 7-3 (E7) | 7-4 (E7) | E7-1 | E7-2 | E7-3 | ... |

SIGNAL TRANSMISSION/RECEPTION CIRCUIT

This application is based upon and claims the benefit of priority from Japanese patent application No. 2011-200790, filed on Sep. 14, 2011, the disclosure of which is incorporated herein in its entirety by reference.

TECHNICAL FIELD

The present invention relates to a signal transmission/reception circuit including a signal transmission circuit and a signal reception circuit connected with each other by a plurality of signal lines, and in particular, to a signal transmission/reception circuit which transmits and receives data with the addition of error checking and correcting codes to the data.

BACKGROUND ART

A signal transmission/reception circuit which transmits and receives data, in which a signal transmission side transmits data with the addition of error checking and correcting codes to the data and a signal reception side checks and corrects errors in the received data using the error checking and correcting codes, has been known (for example, see JP 62-501047 A (Patent Document 1)).

FIG. 24 shows an exemplary format of signals transmitted and received in a signal transmission/reception circuit. In this example, a 3-bit ECC (Error Checking and Correcting) code is added to a 4-bit word to thereby form a code word of 7 bits in total, and respective code words are transmitted and received in units of code words with use of seven signal lines. In this case, by using a hamming code as an ECC code, for example, a 1-bit error in a word can be corrected.

On the other hand, in a video signal transmission device which performs serial transmission by multiplexing digital sound signals with video signals, a technique of adding an error checking and correcting code to each predetermined number of pieces of data of a digital sound signal and then sorting the bits, has been known (for example, see JP 5-219488 A (Patent Document 2)). Specifically, the video signal transmission device disclosed in Patent Document 2 performs writing on a bit-by-bit basis serially into a memory of m×n cells in a row direction, and then performs reading by changing the direction to a column direction.

Patent Document 1: JP 62-501047 A
Patent Document 2: JP 5-219488 A

When data is transmitted between LSIs, the probability of occurrence of errors due to simultaneous switching noise is higher than the probability of soft errors. Simultaneous switching noise is noise generated in a power supply line when a plurality of drivers are switched simultaneously in the same logical direction (for example, in a direction from 0 to 1). When simultaneous switching noise is generated in a power supply line, errors may occur simultaneously in a plurality of signal lines which are receiving power supply from the power supply line. As such, as shown in the signal format of FIG. 24, in a signal transmission/reception circuit in which an error checking and correcting code is added to each word to thereby generate a code word, and transmission is performed in units of code words, if simultaneous switching noise is generated, the probability that an uncorrectable error of 2 bits or more occurs in the same code word would be high.

Meanwhile, as disclosed in Patent Document 2, in the case of performing writing on a bit-by-bit basis serially into a memory of m×n cells in a line direction for a given number of code words, and then performing reading by changing the direction to a column direction, if "m" and "n" are set to be the same as the number of bits of a code word, the signal format as shown in FIG. 24 can be transmitted by being converted into the signal format as shown in FIG. 25. In the signal format of FIG. 25, as the number of bits transmitted at a given time is 1 bit in every code word, even if simultaneous switching noise is generated and an error occurs in every bit on the signal line, an error in each code word is mere 1 bit. As such, the error is correctable in every code word. However, in the signal format of FIG. 25, the entire bits of the same code word are transmitted via the same signal line. As such, if multiple errors occur in any one of the signal lines due to performance degradation caused by aging of an input/output buffer amplifier provided to each signal line, for example, the possibility that an uncorrectable error of 2 bits or more occurs in the same code word would be high.

SUMMARY

An exemplary object of the present invention is to provide a signal transmission/reception circuit capable of solving the above-described problem, that is, a problem that it is difficult to ensure error correction capability with respect to both simultaneous switching errors and multiple errors on a particular signal line.

A signal transmission/reception circuit, according to an exemplary aspect of the present invention, includes a signal transmission circuit and a signal reception circuit connected with each other by a first signal line group and a second signal line group, wherein the signal transmission circuit includes:
a transmission-side data buffer section that stores a given number of input words, and outputs the words in word units to the first signal line group in the order of inputting;
a code generation section that reads a bit string from the transmission-side data buffer section, the bit string having the number of bits which is the same as the number of bits constituting each of the words, a plurality of bits in the bit string being a combination of bits not to be output at the same time within the range of the first signal line group or within the range of a partial signal line group included in the first signal line group, and generates an error checking and correcting code for correcting an error in the readout bit string; and
a code transmission section that outputs respective bits of the error checking and correcting code generated by the code generation section to different signal lines of the second signal line group respectively, with the timing that a plurality of bits in a code word, including a bit string of the error checking and correcting code and the bit string in which the error is to be corrected by the error checking and correcting code, are not output at the same time within the range of the first signal line group and the second signal line group or the range of a partial signal line group included in the first signal line group and the second signal line group, and the signal reception circuit includes:
a reception-side data buffer section that stores a given number of words received from the first signal line group, and outputs the words in word units in the order of receiving;
a reception-side code buffer section that stores a given number of error checking and correcting codes received from the second signal line group; and an error correction section that, when an error checking and correcting code and a bit string in which an error is to be corrected by the error checking and correcting code, included in the same code word, are stored in both the reception-side code buffer section and the reception-side data buffer section, reads the error checking and correcting code of the code word from the reception-side code buffer section, and with use of the readout error checking and correcting code, performs error correction of the bit string in which the error is to be corrected by the error checking and correcting code stored in the reception-side data buffer section.

A signal transmission circuit, according to another exemplary aspect of the present invention, is a signal transmission circuit connected with a first signal line group and a second signal line group, including:

a transmission-side data buffer section that stores a given number of input words, and outputs the words in word units to the first signal line group in the order of inputting;

a code generation section that reads a bit string from the transmission-side data buffer section, the bit string having the number of bits which is the same as the number of bits constituting each of the words, a plurality of bits in the bit string being a combination of bits not to be output at the same time within the range of the first signal line group or within the range of a partial signal line group included in the first signal line group, and generates an error checking and correcting code for correcting an error in the readout bit string; and a code transmission section that outputs respective bits of the error checking and correcting code generated by the code generation section to different signal lines of the second signal line group respectively, with the timing that a plurality of bits in a code word, including a bit string of the error checking and correcting code and the bit string in which the error is to be corrected by the error checking and correcting code, are not output at the same time within the range of the first signal line group and the second signal line group or the range of a partial signal line group included in the first signal line group and the second signal line group.

A signal reception circuit, according to another exemplary aspect of the present invention, is a signal reception circuit connected with a first signal line group and a second signal line group, including:

a reception-side data buffer section that stores a given number of words received in word units from the first signal line group, and outputs the words in word units in the order of receiving;

a reception-side code buffer section that receives, from the second signal line group, an error checking and correcting code for correcting an error in a bit string having the number of bits which is the same as the number of bits constituting each of the words, a plurality of bits in the bit string being a combination of bits not to be output at the same time to a particular signal line group of the first signal line group, the error checking and correcting code being output to different signal lines of the second signal line group respectively with the timing that a plurality of bits in a code word, including a bit string of the error checking and correcting code and the bit string in which the error is to be corrected by the error checking and correcting code, are not output at the same time to a particular signal line group of the first signal line group and the second signal line group, and stores a given number of the error checking and correcting codes; and an error correction section that, when an error checking and correcting code and a bit string in which an error is to be corrected by the error checking and correcting code, included in the same code word, are stored in both the reception-side code buffer section and the reception-side data buffer section, reads the error checking and correcting code of the code word from the reception-side code buffer section, and with use of the readout error checking and correcting code, performs error correction of the bit string in which the error is to be corrected by the error checking and correcting code stored in the reception-side data buffer section.

A signal transmission and reception method, according to another exemplary aspect of the present invention, is a method implemented by a signal transmission/reception circuit in which a signal transmission circuit and a signal reception circuit are connected with each other by a first signal line group and a second signal line group, the signal transmission circuit including a transmission-side data buffer section, a code generation section, and a code transmission section, the signal reception circuit including a reception-side data buffer section, a code storage section, and an error correction section, the method including:

by the transmission-side data buffer section, storing a given number of input words, and outputting the words in word units to the first signal line group in the order of inputting;

by the code generation section, reading a bit string from the transmission-side data buffer section, the bit string having the number of bits which is the same as the number of bits constituting each of the words, a plurality of bits in the bit string being a combination of bits not to be output at the same time within the range of the first signal line group or within the range of a partial signal line group included in the first signal line group, and generating an error checking and correcting code for correcting an error in the readout bit string;

by the code transmission section, outputting respective bits of the error checking and correcting code generated by the code generation section to different signal lines of the second signal line group respectively, with the timing that a plurality of bits in a code word, including a bit string of the error checking and correcting code and the bit string in which the error is to be corrected by the error checking and correcting code, are not output at the same time within the range of the first signal line group and the second signal line group or the range of a partial signal line group included in the first signal line group and the second signal line group;

by the reception-side data buffer section, storing a given number of words received from the first signal line group, and outputting the words in word units in the order of receiving;

by the code storage section, storing a given number of error checking and correcting codes received from the second signal line group; and by the error correction section, when an error checking and correcting code and a bit string in which an error is to be corrected by the error checking and correcting code, included in the same code word, are stored in both the reception-side code buffer section and the reception-side data buffer section, reading the error checking and correcting code of the code word from the reception-side code buffer section, and with use of the readout error checking and correcting code, performing error correction of the bit string in which the error is to be corrected by the error checking and correcting code stored in the reception-side data buffer section.

As the present invention has the configuration described above, it is possible to ensure error correction capability with respect to both simultaneous switching errors and multiple errors which occur on a particular signal line.

BRIEF DESCRIPTION OF DRAWINGS

FIG. 3 is a table showing a format of signals input to the signal transmission circuit according to the second exemplary embodiment of the present invention;

FIG. 4 is a table showing a format of signals output from the signal transmission circuit according to the second exemplary embodiment of the present invention;

FIG. 7 is an illustration of operation of the signal transmission circuit according to the fourth exemplary embodiment of the present invention;

FIG. 8 is a table showing a format of signals output from the signal transmission circuit according to the fourth exemplary embodiment of the present invention;

FIG. 12 is a table showing a format of signals output from the signal transmission circuit according to the sixth exemplary embodiment of the present invention;

FIG. 16 is a table showing a format of signals output from the signal transmission circuit according to the eighth exemplary embodiment of the present invention;

FIG. 19 is an illustration of operation of the signal transmission circuit according to the tenth exemplary embodiment of the present invention;

FIG. 20 is a table showing a format of signals output from the signal transmission circuit according to the tenth exemplary embodiment of the present invention;

FIG. 24 is a table showing a format of signals output from a signal reception circuit related to the present invention; and FIG. 25 is a table showing a format of signals output from a signal reception circuit related to the present invention;

EXEMPLARY EMBODIMENTS

Next, exemplary embodiments of the present invention will be described in detail with reference to the drawings.

First Exemplary Embodiment

Figure 1:
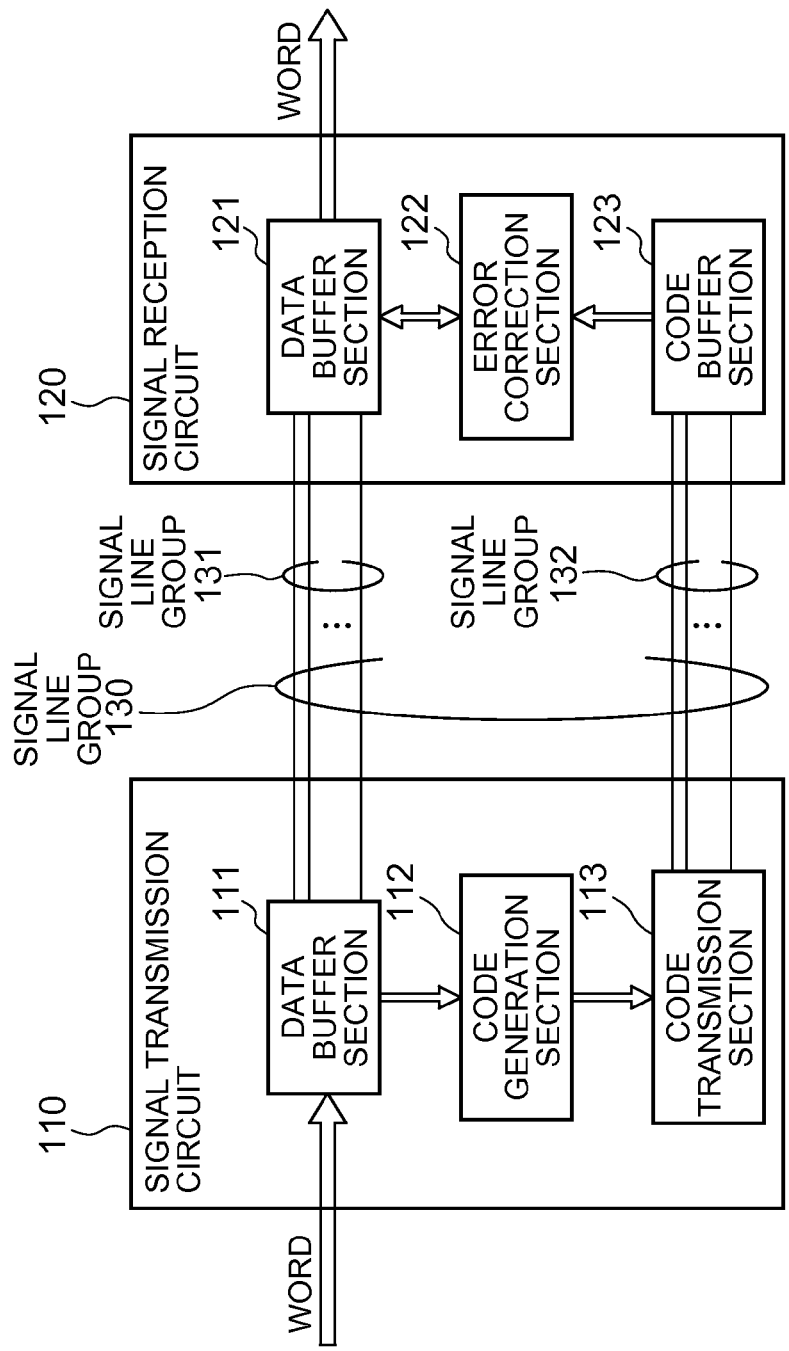
FIG. 1 is a block diagram showing a signal transmission/reception circuit according to a first exemplary embodiment of the present invention.

Referring to FIG. 1, a signal transmission/reception circuit 100 according to a first exemplary embodiment of the present invention includes a signal transmission circuit 110, and a signal reception circuit 120 connected with the signal transmission circuit 110 via a signal line group 130. The signal line group 130 consists of a plurality of signal lines. The signal line group 130 includes a signal line group 131 used for transmitting words, and a signal line group 132 used for transmitting error checking and correcting (ECC) codes.

The signal transmission circuit 110 has a function of serially inputting a plurality of words each having a plurality of bits, and from these words, generating a plurality of code words each including information bits having the same number of bits as those of the word and an ECC code, and transmitting them to the signal reception circuit 120 via the signal line group 130. In this step, the signal transmission circuit 110 outputs the bits of a code word in such a manner that a plurality of bits of the same code word are not output to a particular signal line group of the signal line group 130 in parallel at the same time, and that the respective bits of the ECC code of the same code word are output to different signals lines of the signal line group 132.

In this example, a particular signal line group means a group of signal lines in which the power source of the drive circuits which drives the signal lines is the same. Accordingly, in the case of a single power source, the entire signal line group 130 forms one particular signal line group. If the signal line group 131 and the signal line group 132 are respectively connected with drive circuits which are driven by different power sources, each of the signal line group 131 and the signal line group 132 forms one particular signal line group. Further, if the signal line group 131 includes a signal line group connected with drive circuits driven by one power source and a signal line group connected with drive circuits driven by another power source, the signal lines connected with the drive circuits driven by the same power source in the signal line group 131 form one particular signal line group. Generally, in an LSI (Large Scale Integration) and an FPGA (Field Programmable Gate Array), power-supply noise when signals are output is generated almost independently on a power supply basis which is determined by the power supply lines on the chip of the LSI/FPGA, that is, on a power bank basis. As such, there is no need to consider simultaneous switching noise between different power banks. However, this does not prevent such a consideration.

The signal transmission circuit 110 of the present embodiment includes a data buffer section 111, a code generation section 112, and a code transmission section 113.

The data buffer section 111 has a function of storing a given number of input words and outputting them in word units in the order of inputting the words, to the signal line group 131.

The code generation section 112 has a function of extracting, from the words stored in the data buffer section 111, a bit string having the same number of bits as the number of bits constituting a word, generating an ECC code in which the extracted bit string provides a correction range thereof, that is, an ECC code for correcting an error in the extracted bit string, and outputting it to the code transmission section 113. When extracting the bit string, the code generation section 112 extracts a bit string in which a plurality of bits in the bit string are a combination of bits not to be output at the same time to a particular signal line group of the signal line group 131. In extracting the bit string, it is preferable that the code generation section 112 extracts a bit string in which a combination of any 2 bits in the bit string are a combination of bits not to be output at the same time to a particular signal line group of the signal line group 131.

The code transmission section 113 has a function of transmitting the respective bits of the ECC code generated by the code generation section 112 to different signal lines of the signal line group 132 by adjusting the output time thereof. The code transmission section 113 performs transmission of the respective bits of the ECC code, with the timing that a plurality of bits in a code word, constituted of the bit string of the ECC code and the bit string in which the error is to be corrected by the ECC code, are not output in parallel at the same time to the signal line group 130. Preferably, the code transmission section 113 performs transmission of the respective bits of the ECC code with the timing that a combination of any 2 bits in the code word, constituted of the bit string of the ECC code and the bit string in which the error is to be corrected by the ECC code, are not output in parallel at the same time to the signal line group 130.

The signal reception circuit 120 has a function of receiving a plurality of code words from the signal transmission circuit 110 via the signal line group 130, performing error correction of information bits using an ECC code for each of the received code words, and outputting data formed of the information bits on which error correction has been performed, in word units. In the present embodiment, the signal reception circuit 120 includes a data buffer section 121, a code buffer section 122, and an error correction section 123.

The data buffer section 121 has a function of storing a given number of words received from the signal line group 131, and outputting them in word units in the order of receiving the words.

The code buffer section 122 has a function of storing a given number of ECC codes received from the signal line group 132.

The error correction section 123 has a function of, when the ECC code and the bit string in which the error is to be corrected by the ECC code which constitute the same code word are stored in both the code buffer section 122 and the data buffer section 121, reading the ECC code of such a code word from the code buffer section 122, and with use of the readout ECC code, performing error correction of the bit string in which the error is to be corrected by the ECC code stored in the data buffer section 121.

In the present embodiment, as an ECC code, a hamming code or an extended hamming code may be used. The required number of bits in that case is as follows:

| Number of bits of word | Hamming code | Extended hamming code |
|---|---|---|
| 4 bits | 3 bits | 4 bits |
| 8 bits | 4 bits | 5 bits |
| 16 bits | 5 bits | 6 bits |
| 32 bits | 6 bits | 7 bits |
| 64 bits | 7 bits | 8 bits |

Further, in the present embodiment, as an ECC code, a code enabling multiple bit correction (for example, BCH code) or a code enabling block correction (for example, Read-Solomon code) may be used.

Next, operation of the present embodiment will be described.

When words are input serially from the outside, the data buffer section 111 of the signal transmission circuit 110 temporarily stores the input words, and after a delay of a predetermined time period, transmits them in word units to the signal reception circuit 120 via the signal line group 131. Further, the code generation section 112 of the signal transmission circuit 110 extracts, from across the words stored in the data buffer section 111, a bit string having the same number of bits as those constituting a word, in which a plurality of bits (preferably, a combination of any 2 bits) in the bit string are a combination of bits not to be output at the same time to a particular signal line group of the signal line group 131, and generates an ECC code for correcting an error in the extracted bit string. Further, the code transmission section 113 of the signal transmission circuit 110 outputs, to different signal lines of the signal line group 132 respectively, the respective bits of the ECC code generated by the code generation section 112 in such a manner that a plurality of bits (preferably a combination of any 2 bits) in the code word constituted of the bit string of the ECC code and the bit string in which the error is to be corrected by the ECC code are not output at the same time to the signal line group 130.

On the other hand, the data buffer section 121 of the signal reception circuit 120 temporarily stores the words received from the signal line group 131, delays them by a predetermined time period (if there are any error bits, they are corrected by the error correction section 123 in this time period), and outputs them in word units. Further, the code buffer section 122 of the signal reception circuit 120 stores the ECC codes received in a past certain time period from the signal line group 132. Then, the error correction section 123 of the signal reception circuit 120 extracts the ECC code constituting the code word from the code buffer section 122, and with use of the extracted ECC code, performs error correction of the bit string in which the error is to be corrected by the ECC code, among the bit strings in the data buffer section 121.

As described above, according to the signal transmission/reception circuit 100 of the present embodiment, it is possible to ensure error correction capability with respect to both simultaneous switching errors and multiple errors which occur on a particular signal line. This is because as a plurality of bits of the same code word are not output at the same time on a particular signal line group of the signal line group 130, that is, on a plurality of signal lines in which the drive circuits driving the signal lines use the same power source, even if simultaneous switching errors occur, the probability that errors occur in a plurality of bits of the same code word can be reduced. Further, as the respective bits of the ECC code of the same code word are not output to the same signal line, even if multiple errors occur on a particular signal line, the probability that errors occur in a plurality of bits of the same code word can be reduced.

Second Exemplary Embodiment

Figure 2:
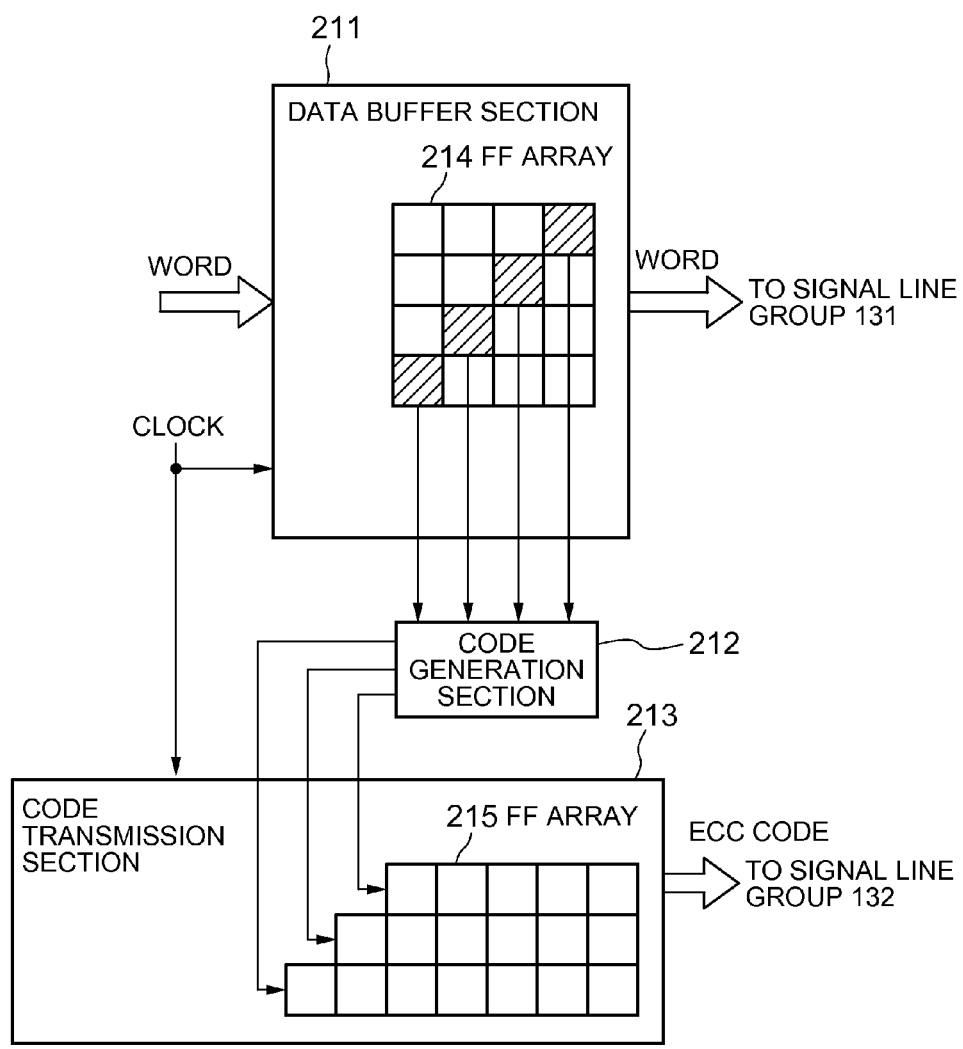
FIG. 2 is a block diagram showing a signal transmission circuit according to a second exemplary embodiment of the present invention.

Referring to FIG. 2, a signal transmission circuit 210 according to a second exemplary embodiment of the present invention includes a data buffer section 211, a code generation section 212, and a code transmission section 213. Hereinafter, the configuration of each of the sections will be described using, as an example, a hamming code in which the number of bits of a word is 4 bits and the number of bits of an ECC code is 3 bits.

The data buffer section 211 includes a flip-flop array (FF array) 214 having 4 (=word length)×4 (=word length) pieces of cells. Each cell is formed of one flip-flop. Hereinafter, it is defined that the horizontal direction of a sheet is a row, the vertical direction thereof is a column, and a cell in the $i^{th}$ row and the $j^{th}$ column is expressed as $C_{i,j}$. The data buffer section 211 receives words in synchronization with the clock. The respective bits of each word, input to the data buffer section 211, are input to the cells $C_{1,1}$, $C_{2,1}$, $C_{3,1}$, and $C_{4,1}$ in the first column of the FF array 214. In this step, the bit information stored in each cell is moved to a cell in the next column, and the pieces of bit information stored in the cells $C_{1,4}$, $C_{2,4}$, $C_{3,4}$, and $C_{4,4}$ in the last column are output to the signal line group 131. This means that each row of the FF array 214 constitutes a shift register. Further, the pieces of bit information stored in the cells of the FF array 214 can be read in parallel. In the present embodiment, a total of 4 (=word length) bits are read from the cells $C_{1,4}$, $C_{2,3}$, $C_{3,2}$, and $C_{4,1}$, and are output to the code generation section 212. The cells to be read are not limited to those described in this example. It is only necessary to read bit information of 4 (=word length) bits in total from the cells in such a manner that the cells in different rows have different column positions, among the cells in the respective rows of the FF array 21.

Each time a new word is input to the FF array 214, the code generation section 212 generates a 3-bit ECC code for correcting errors of 4 bits read from the cells $C_{1,4}$, $C_{2,3}$, $C_{3,2}$, and $C_{4,1}$ of the FF array 214. The respective bits of the ECC code are output to the code transmission section 213.

The code transmission section 213 includes an FF array 215. The number of rows of the FF array 215 is 3, which is equal to the number of bits of the ECC code. In the first row, 5 pieces of cells are arrayed, the number of which equals to the number of columns of the FF array 214 with an addition of 1. In the second row, 6 pieces of cells are arrayed, the number of which equals to the number of columns of the FF array 214 with an addition of 2. In the third row, 7 cells are arrayed, the number of which equals to the number of columns of the FF array 214 with an addition of 3. Each of the cells is formed of one flip-flop. The code transmission section 213 receives ECC codes in synchronization with the clock. The respective bits of each ECC code, input to the code transmission section 213, are input to the cells $C_{1,1}$, $C_{2,1}$, and $C_{3,1}$ in the first column of the respective rows of the FF array 215. In this step, the bit information stored in each cell is moved to a cell in the next column, and the pieces of bit information stored in the cells $C_{1,5}$, $C_{2,6}$, and $C_{3,7}$ in the last column are output to the signal line group 132. This means that the respective rows of the FF array 215 constitute shift registers having different numbers of stages.

Next, operation of the signal transmission circuit 210 according to the present embodiment will be described.

FIG. 3 shows a time series of words input to the signal transmission circuit 210. In FIG. 3, the vertical direction shows the sequence of the bits in a word, and the horizontal direction shows the time. In order to discriminate a word from another word, and to discriminate the bits in a word from other bits, a reference code in the form of "word identifier—intra-word identifier" is given to each bit of a word. For example, a bit 7-1 input at a time t7 shows the $1^{st}$ bit of the $7^{th}$ input word.

The data buffer section 211 of the signal transmission circuit 210 inputs the words, input in the order as shown in FIG. 3, to the FF array 214 in synchronization with the clock. Further, the data buffer section 211 outputs the words, output from the FF array 214, to the signal line group 131.

On the other hand, in parallel to the above-described operation of the data buffer section 211, each time a new word is input to the FF array 214, the code generation section 212 generates a 3-bit ECC code for correcting errors of 4 bits read from the cells $C_{1,4}$, $C_{2,3}$, $C_{3,2}$, and $C_{4,1}$ of the FF array 214, and outputs it to the code transmission section 213.

The code transmission section 213 serially inputs the ECC codes to the FF array 215 in synchronization with the clock. Further, the code transmission section 213 outputs the bits of the ECC codes, output from the FF array 215, to the signal line group 132.

FIG. 4 shows a time series of words and ECC codes output from the data buffer section 211 and the code transmission section 213 to the signal line groups. In FIG. 4, the vertical direction shows the order of bits in a word and in an ECC code, and the horizontal direction shows the time. In order to distinguish an ECC code from ECC codes of other code words, and to distinguish the bits in the ECC code of the same code word from other bits, a reference code in the form of "code word identifier—intra-ECC code identifier" is given to each bit of an ECC code. For example, a bit E3-1 output at a time t11 shows that it is the $1^{st}$ bit in the ECC code of the $3^{rd}$ code word. Further, in order to clarify a code word to which each bit of each word belongs, a code word identifier is given in parentheses to a bit of a word. For example, a bit 7-3(E5), which is the $3^{rd}$ bit in the $7^{th}$ word, shows that it belongs to the $5^{th}$ code word.

Referring to FIG. 4, in the present embodiment, the bits constituting a code word are arranged in two dimensions with respect to the parallel transmission direction of the signal line group and the time direction, and the bits output at the same time and the bits output to the same signal line are mere 1 bit per code word. Accordingly, even if errors occur in all of the bits on a signal line group due to simultaneous switching noise, as the respective bits belong to different code words respectively, the errors can be corrected. For example, if errors occur in all of the bits 7-1 to 7-4 transmitted at a time t11, as the bit 7-1 belongs to the $7^{th}$ code word, the bit 7-2 belongs to the $6^{th}$ code word, the bit 7-3 belongs to the $5^{th}$ code word, and the bit 7-4 belongs to the $4^{th}$ code word, respectively, when error correction of 1 bit is performed on each code word, it is possible to perform error correction on all of the bits of the word constituted of the bits 7-1 to 7-4, consequently.

Further, as the bits output to the same signal line are mere 1 bit per code word, even if multiple errors occur in any one of the signal lines, as the respective bits belong to different code words respectively, the errors can be corrected.

It should be noted that as error correction cannot be performed on the first 3 words after the start of communication and the last 3 words in the present embodiment, the present embodiment is suitable for a device in which word signals flow constantly and continuously.

Third Exemplary Embodiment

Figure 5:
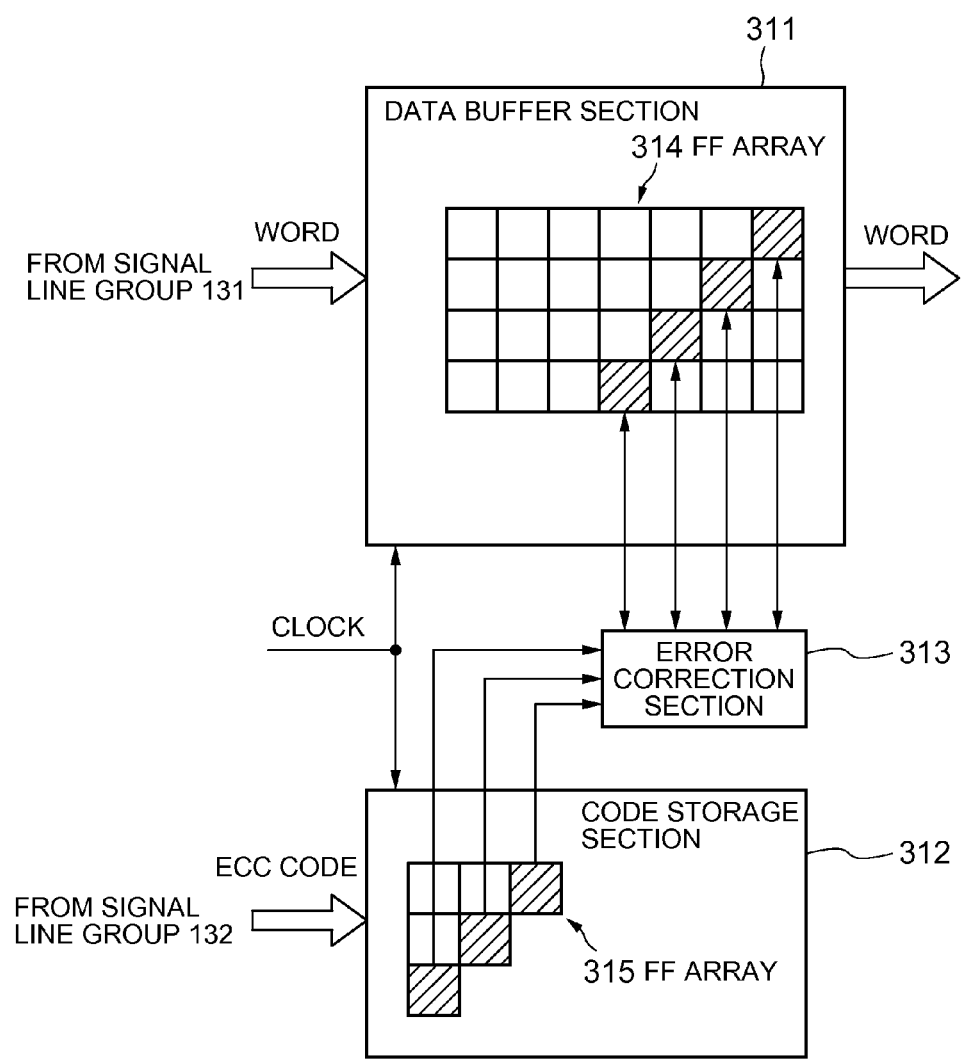
FIG. 5 is a block diagram showing a signal reception circuit according to a third exemplary embodiment of the present invention.

Referring to FIG. 5, a signal reception circuit 310 according to a third exemplary embodiment of the present invention includes a data buffer section 311, a code storage section 312, and an error correction section 313. Hereinafter, the configuration of each of the sections will be described using, as an example, a hamming code in which the number of bits of a word is 4 bits and the number of bits of an ECC code is 3 bits.

The data buffer section 311 includes a flip flop array (FF array) 314 having 7 (=code word length)×4 (=word length)

pieces of cells. Each cell is formed of one flip flop. The data buffer section 311 receives words input from a signal line 131 in synchronization with the clock. The respective bits of each word, input to the data buffer section 311, are input to the cells $C_{1,1}$, $C_{2,1}$, $C_{3,1}$, and $C_{4,1}$ in the first column of the respective rows of the FF array 314. In this step, the bit information stored in each cell is moved to a cell in the next column, and the pieces of bit information stored in the cells $C_{1,7}$, $C_{2,7}$, $C_{3,7}$, and $C_{4,7}$ in the last column are output to the outside. As such, each row of the FF array 314 constitutes a shift register. Further, the pieces of bit information stored in the cells of the FF array 314 can be read and written in parallel. In the present embodiment, a total of 4 (=word length) bits are read from the cells $C_{1,7}$, $C_{2,6}$, $C_{3,5}$, and $C_{4,4}$ storing the information bits of the same code word, and are output to the error correction section 313.

The code storage section 312 includes an FF array 315. The number of rows of the FF array 315 is 3, which is equal to the number of bits of an ECC code. In the first row, three cells are arrayed, in the second row, two cells are arrayed, and in the third row, one cell is arrayed. Each of the cells is formed of one flip flop. The code storage section 312 receives an ECC code input from the signal line group 132 in synchronization with the clock. The respective bits of the ECC code, input to the code storage section 312, are input to the cells $C_{1,1}$, $C_{2,1}$, and $C_{3,1}$ in the first column of the FF array 315. In this step, the bit information stored in each cell is moved to a cell in the next column, and the bit information stored in the last column is discarded.

The error correction section 313 has a function of reading the entire bits of an ECC code and the entire bits of the bit string in which an error is to be corrected by the ECC code, which constitute the same code word, from the FF array 315 and the FF array 314, each time a new bit string is input from the signal line group 130. Specifically, the error correction section 313 reads, by each clock, an ECC code stored in the cells $C_{1,3}$, $C_{2,2}$, and $C_{3,1}$ of the FF array 315, and the information bits stored in the cells $C_{1,7}$, $C_{2,6}$, $C_{3,5}$, and $C_{4,4}$ of the FF array 314. Further, the error correction section 313 has a function of performing error checking of the readout information bits based on the readout information bits and the ECC code, and if detecting an error of 1 bit, performing error correction on such information bits using the ECC code, and writing back the corrected information bits into the original cells $C_{1,7}$, $C_{2,6}$, $C_{3,5}$, and $C_{4,4}$ of the FF array 314.

Next, operation of the signal reception circuit 310 of the present embodiment will be described.

To the signal reception circuit 310, time series signals as shown in FIG. 4 are input via the signal line group 130. The data buffer section 311 of the signal reception circuit 310 serially inputs the bit strings of words, having been input in the order as shown in FIG. 4, to the FF array 314 in synchronization with the clock, delays them by a predetermined time period, and outputs them in word units. If there is any error bit, it is corrected by the error correction section 313 within this predetermined time period.

Each time a new bit string is input from the signal line group 130 to the data buffer section 311 and the code storage section 312, the error correction section 313 reads a code word constituted of the ECC code stored in the cells $C_{1,3}$, $C_{2,2}$, and $C_{3,1}$ of the FF array 315 and the information bits stored in the cells $C_{1,7}$, $C_{2,6}$, $C_{3,5}$, and $C_{4,4}$ of the FF array 314. Then, the error correction section 313 performs error checking of the readout code word. Then, if detecting an error of 1 bit, the error correction section 313 corrects the error in the information bits of the code word based on the ECC code of the readout code word, and writes back the corrected information bits into the original cells $C_{1,7}$, $C_{2,6}$, $C_{3,5}$, and $C_{4,4}$ of the FF array 314.

According to the present embodiment, it is possible to provide a signal reception circuit which can be used in combination with the signal transmission circuit of the second exemplary embodiment.

Fourth Exemplary Embodiment

Figure 6:
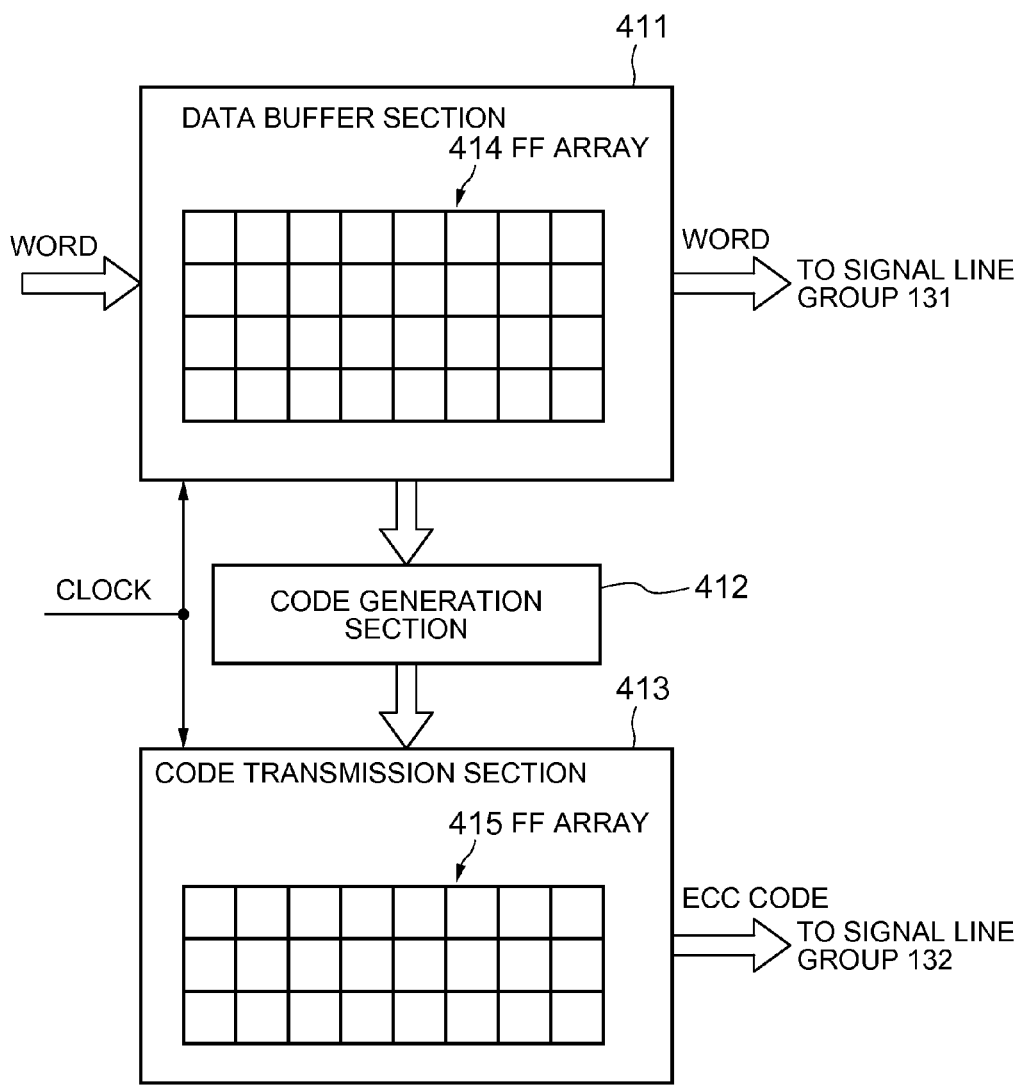
FIG. 6 is a block diagram showing a signal transmission circuit according to a fourth exemplary embodiment of the present invention.

Referring to FIG. 6, a signal transmission circuit 410 according to a fourth exemplary embodiment of the present invention includes a data buffer section 411, a code generation section 412, and a code transmission section 413. Hereinafter, the configuration of each of the sections will be described using, as an example, a hamming code in which the number of bits of a word is 4 bits and the number of bits of an ECC code is 3 bits.

The data buffer section 411 includes an FF array 414 having 8 (=word length×2)×4 (=word length) cells. Each cell is formed of one flip flop. The data buffer section 411 receives words in synchronization with the clock. The respective bits of each word, input to the data buffer section 411, are input to the cells $C_{1,1}$, $C_{2,1}$, $C_{3,1}$, and $C_{4,1}$ in the first column of the respective rows of the FF array 414. In this step, the bit information stored in each cell is moved to a cell in the next column, and the pieces of bit information stored in the cells $C_{1,8}$, $C_{2,8}$, $C_{3,8}$, and $C_{4,8}$ in the last column are output to the signal line group 131. As such, each row of the FF array 414 constitutes a shift register. Further, the pieces of bit information stored in the cells of the FF array 414 can be read in parallel. In the present embodiment, every 8 clocks, a total of 32 (=word length×8) bits are read from the entire cells by the code generation section 412.

The code generation section 412 has a function of reading a total of 32 bits for 8 words from the entire cells of the FF array 414 of the data buffer section 411, a function of dividing the 32 bits into 8 groups each having a 4-bit length, and a function of generating, for each of the groups, 8 pieces of ECC codes each having a 3-bit length for correcting an error in the bit string belonging to each group. When dividing, the code generation section 412 divides the bit string in such a manner that a combination of any 2 bits in any bit string are neither a combination of bits stored in cells in the same row of the FF array 414 nor a combination of bits stored in cells in the same column of the FF array 414. Specifically, in the present embodiment, the cells of the FF array 414 are divided into 8 groups as shown below (see FIG. 7).

Group 1: $C_{1,8}$, $C_{2,7}$, $C_{3,6}$, $C_{4,5}$
Group 2: $C_{1,7}$, $C_{2,6}$, $C_{3,5}$, $C_{4,4}$
Group 3: $C_{1,6}$, $C_{2,5}$, $C_{3,4}$, $C_{4,3}$
Group 4: $C_{1,5}$, $C_{2,4}$, $C_{3,3}$, $C_{4,2}$
Group 5: $C_{1,4}$, $C_{2,3}$, $C_{3,2}$, $C_{4,1}$
Group 6: $C_{1,3}$, $C_{2,2}$, $C_{3,1}$, $C_{4,8}$
Group 7: $C_{1,2}$, $C_{2,1}$, $C_{3,8}$, $C_{4,7}$
Group 8: $C_{1,1}$, $C_{2,8}$, $C_{3,7}$, $C_{4,6}$ The ECC codes, having a total of 24 bits, of the 8 groups generated by the code generation section 412 are output to the code transmission section 413.

The code transmission section 413 includes an FF array 415 having 8 (=word length×2)×3 (=code length) pieces of cells. Each cell is formed of one flip-flop. The code transmission section 413 inputs ECC codes of 24 bits in total for the 8 groups, generated by the code generation section 412, to the 24 pieces of cells of the FF array 415. When inputting, the code transmission section 413 performs inputting in such a manner that a combination of any 2 bits in the ECC code of the same code word are not a combination of bits in the same row and the same column of the FF array 415, and that the column of the FF array 415 storing each bit of the ECC code of the same code word is not the same as the column of the FF array 414 storing the bit string in which the error is to be corrected by the ECC code. Specifically, in the present embodiment, the code bits of the respective groups are input in the following cells (see FIG. 7).

Group 1: $C_{1,4}, C_{2,3}, C_{3,2}$
Group 2: $C_{1,3}, C_{2,2}, C_{3,1}$
Group 3: $C_{1,2}, C_{2,1}, C_{3,8}$
Group 4: $C_{1,1}, C_{2,8}, C_{3,7}$
Group 5: $C_{1,8}, C_{2,7}, C_{3,6}$
Group 6: $C_{1,7}, C_{2,6}, C_{3,5}$
Group 7: $C_{1,6}, C_{2,5}, C_{3,4}$
Group 8: $C_{1,5}, C_{2,4}, C_{3,3}$ Further, when the code transmission section 413 stores the ECC code in the FF array 415, the code transmission section 413 moves the bit information of the ECC code stored in the cell of each column of the FF array 415 to a cell in the next column in synchronization with the clock, and the pieces of bit information stored in the cells $C_{1,8}, C_{2,8}$, and $C_{3,8}$ in the last column are output to the signal line group 132.

Next, operation of the signal transmission circuit 410 according to the present embodiment will be described.

To the signal transmission circuit 410, time series signals as shown in FIG. 3 are input. The data buffer section 411 of the signal transmission circuit 410 serially inputs the words, input in the order shown in FIG. 3, to the FF array 414 in synchronization with the clock. Then, when the data buffer section 411 inputs data of 8 words to the FF array 414, after the bits of the entire cells in the FF array 414 are output to the code generation section 412, the data buffer section 411 serially inputs data of 8 words to the FF array 414 again. Along with the inputting, the words output from the FF array 414 are serially output to the signal line group 131. In synchronization with the outputting, the ECC codes are serially output from the FF array 415 of the code transmission section 413 to the signal line group 132.

On the other hand, each time data of 8 words is input to the FF array 414, the code generation section 412 reads the data of the 8 words from the FF array 414, divides the data into 8 groups each having a 4-bit length as shown in FIG. 7, generates ECC codes of 24 bits in total for correcting errors in the information bits belonging to the respective groups, and outputs them to the code transmission section 413. Then, the code transmission section 413 stores the 24-bit ECC codes for 8 groups in the FF array 415 in the format as shown in FIG. 7, and outputs them from the FF array 415 in synchronization with the clock. The ECC codes, output from the FF array 415, are serially output to the signal line group 132.

FIG. 8 is a time series of words and ECC codes output from the data buffer section 411 and the code transmission section 413 to the signal line groups. As shown in FIG. 8, in the present embodiment, the bits constituting a code word are two-dimensionally arranged with respect to the parallel transmission direction and the time direction of the signal line group, and the bits output at the same time and the bits output to the same signal line are mere 1 bit per code word. Accordingly, it is possible to ensure error correction capability with respect to both simultaneous switching errors and multiple errors on a particular signal line.

Further, in the present embodiment, every 8 words (2×word length), the information bits of the 8 words and the entire bits of the ECC codes for the words can be transmitted. As such, the present embodiment is particularly suitable for transmission of burst data.

Fifth Exemplary Embodiment

Figure 9:
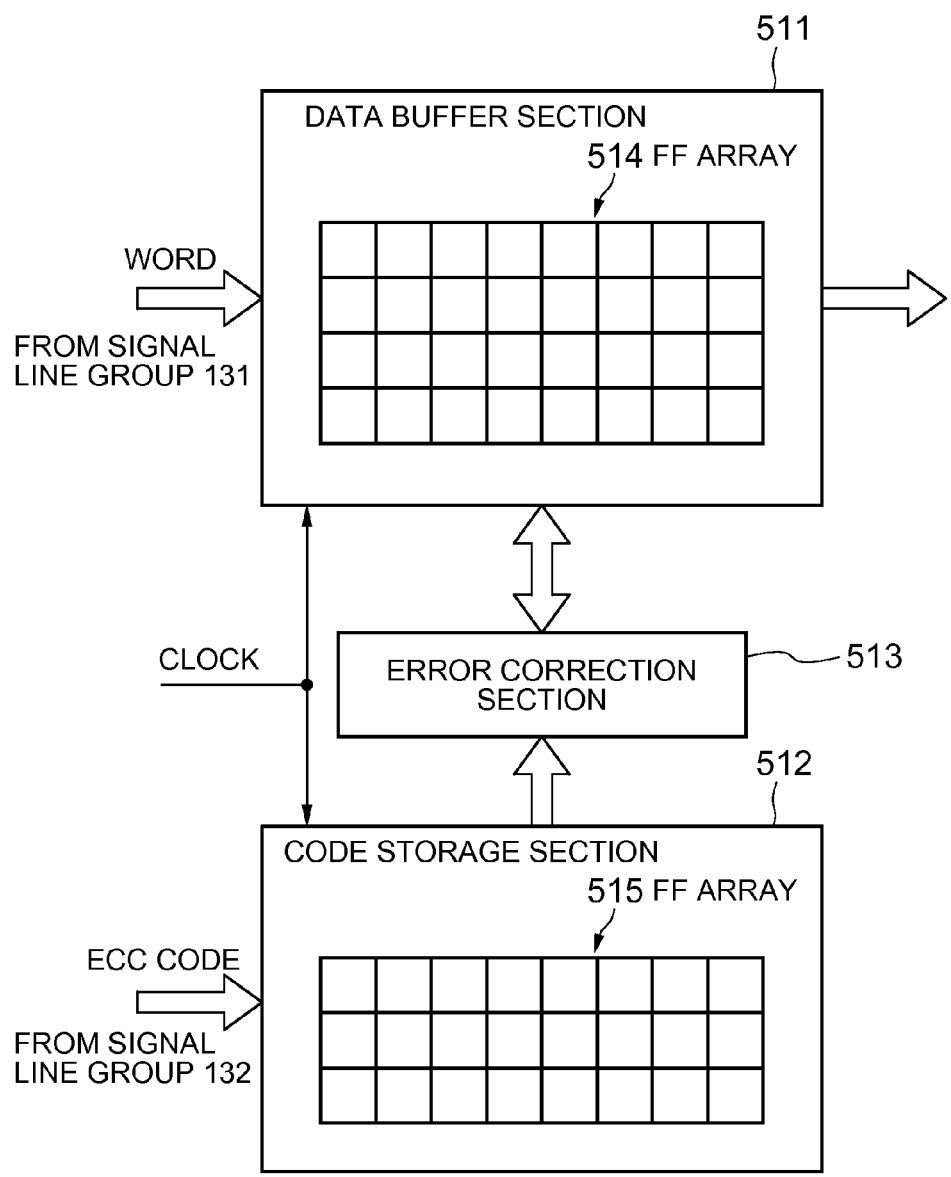
FIG. 9 is a block diagram showing a signal reception circuit according to a fifth exemplary embodiment of the present invention.

Referring to FIG. 9, a signal reception circuit 510 according to a fifth exemplary embodiment of the present invention includes a data buffer section 511, a code storage section 512, and an error correction section 513. Hereinafter, the configuration of each of the sections will be described using, as an example, a hamming code in which the number of bits of a word is 4 bits and the number of bits of an ECC code is 3 bits.

The data buffer section 511 includes an FF array 514 having 8 (=word length×2)×4 (=word length) pieces of cells. Each cell is formed of one flip-flop. The data buffer section 511 receives words in synchronization with the clock. The respective bits of each word, input to the data buffer section 511, are input to the cells $C_{1,1}, C_{2,1}, C_{3,1}$, and $C_{4,1}$ in the first column of the respective rows of the FF array 514. In this step, the bit information stored in each cell is moved to a cell in the next column, and the pieces of bit information stored in the cells $C_{1,8}, C_{2,8}, C_{3,8}$, and $C_{4,8}$ in the last column are output to the outside. As such, each row of the FF array 514 constitutes a shift register. Further, the pieces of bit information stored in the cells of the FF array 514 can be read and written in parallel. In the present embodiment, every 8 clocks, a total of 32 (=word length×8) bits are read from the entire cells by the error correction section 513. Further, when error correction is performed, the corrected information bit is written back to the corresponding cell of the FF array 514.

The code storage section 512 includes an FF array 515 having 8 (=word length×2)×3 (=ECC code length) pieces of cells. Each cell is formed of one flip-flop. The code storage section 512 receives the bits of an ECC code input from the signal line group 132 in synchronization with the clock. The respective bits of the ECC code, input to the code storage section 512, are input to the cells $C_{1,1}, C_{2,1}$, and $C_{3,1}$ in the first column of the respective rows of the FF array 515. In this step, the bit information stored in each cell is moved to a cell in the next column, and the pieces of bit information stored in the cells $C_{1,8}, C_{2,8}$, and $C_{3,8}$ in the last column are discarded. As such, each row of the FF array 515 constitutes a shift register. Further, the pieces of bit information stored in the cells of the FF array 515 can be read and written in parallel. In the present embodiment, every 8 clocks, a total of 24 (=ECC code length×8) bits are read by the error correction section 513.

The error correction section 513 has a function of reading information bits and ECC code bits of a total of 8 code words from the FF array 514 and the FF array 515, a function of correcting the bit string in which an error is corrected by the ECC code using the ECC code for each of the code words, and a function of writing back the corrected bit string to the original cells of the FF array 514. The error correction section 513 performs this processing within one clock.

Next, operation of the signal reception circuit 510 according to the present embodiment will be described.

To the signal reception circuit 510, time series signals as shown in FIG. 8 are input via the signal line group 130. The data buffer section 511 and the code storage section 512 of the signal reception circuit 510 serially input the bit string, input in the order as shown in FIG. 8, to the FF arrays 514 and 515 in synchronization with the clock.

Every 8 clocks, that is, each time a total of 8 code words including 8 words and the ECC codes thereof are stored in the FF array 514 and the FF array 515, the error correction section 513 reads the information bits and the ECC code bits of the 8 code words from the FF array 514 and the FF array 515, and for each code word, corrects the bit string in which an error is corrected by the ECC code using the ECC code, and writes back the corrected bit string to the original cells of the FF array 514.

The above-described processing by the error correction section 513 is performed within one clock. Then, in synchronization with the clock, the next 8 code words are serially input from the signal line group to the FF array 514 and the FF array 515, and along with it, the words in which the errors have been corrected are serially output from the FF array 514 and then output to the outside.

According to the present embodiment, it is possible to provide a signal reception circuit which can be used in combination with the signal transmission circuit of the third exemplary embodiment.

Sixth Exemplary Embodiment

Figure 10:
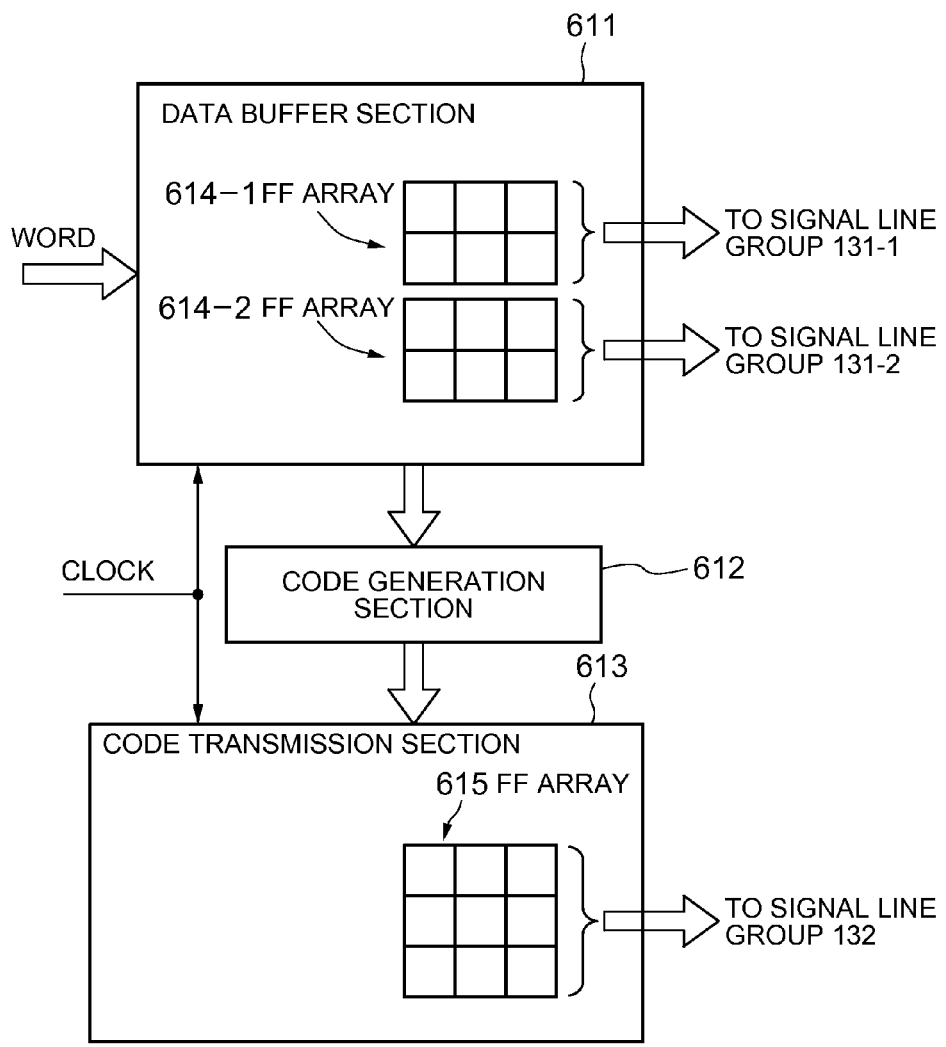
FIG. 10 is a block diagram showing a signal transmission circuit according to a sixth exemplary embodiment of the present invention.

Referring to FIG. 10, a signal transmission circuit 610 according to a sixth exemplary embodiment of the present invention includes a data buffer section 611, a code generation section 612, and a code transmission section 613. Hereinafter, the configuration of each of the sections will be described using, as an example, a hamming code in which the number of bits of a word is 4 bits and the number of bits of an ECC code is 3 bits. Further, it is assumed that the signal line group 131 connected with the signal transmission circuit 610 is divided into a signal line group 131-1 belonging to a power bank A and a signal line group 131-2 belonging to a power bank B, and that the signal line group 132 connected with the code transmission section 613 belongs to another power bank C.

The data buffer section 611 includes an FF array 614-1 associated with the signal line group 131-1 and an FF array 614-2 associated with the signal line group 131-2. Each of the arrays 614 includes 3×2 (=1/word length) pieces of cells. Each cell is formed of one flip-flop. The data buffer section 611 receives words in synchronization with the clock. The respective bits of each word, input to the data buffer section 611, are input to the cells $C_{1,1}$ and $C_{2,1}$ in the first columns of the respective rows of the two FF arrays 614. In this step, the bit information stored in each cell is moved to a cell in the next column, and the pieces of bit information stored in the cells $C_{1,3}$ and $C_{2,3}$ in the last columns are output to the signal line groups 131-1 and 131-2. As such, each row of the two FF arrays 614 constitutes a shift register. Further, the pieces of bit information stored in the cells of the two FF arrays 614 can be read in parallel. In the present embodiment, every 3 clocks, a total of 6 bits are read from the entire cells for each of the two FF arrays 614 by the code generation section 612.

The code generation section 612 has a function of, for each of the FF arrays 614, reading information bits from 6 pieces of cells of the FF array 614, and a function of dividing the bit string of the 6 bits into 3 groups each having a 2-bit length. When dividing the bit string, the code generation section 612 divides the bit string in such a manner that a combination of any 2 bits in any bit string are neither a combination of bits stored in cells in the same row of the same FF array 614 nor a combination of bits stored in cells in the same column of the same FF array 614. Specifically, in the present embodiment, it is divided into the following groups of cells (see FIG. 11).

Group 1: $C_{1,3}$, $C_{2,2}$
Group 2: $C_{1,2}$, $C_{2,1}$
Group 3: $C_{1,1}$, $C_{2,3}$ Further, for each group, the code generation section 612 has a function of generating a 3-bit ECC code for correcting an error in a bit string of a total of 4 bits belonging to the same group of the two FF arrays 614. ECC codes, having 9 bits in total, for the groups generated by the code generation section 614 are output to the code transmission section 613.

The code transmission section 613 includes an FF array 615 having 3×3 (=ECC code length) pieces of cells. Each cell is formed of one flip-flop. The code transmission section 613 inputs an ECC code having a total of 9 bits for the 3 groups, generated by the code generation section 612, to the 9 pieces of cells of the FF array 615. When inputting the code, the code transmission section 613 performs inputting in such a manner that a combination of any 2 bits in the ECC code of the same code word are not a combination of bits to be input in the same row and the same column of the FF array 615. Specifically, in the present embodiment, they are input as shown below (see FIG. 7).

Group 1: $C_{1,3}$, $C_{2,2}$, $C_{3,1}$
Group 2: $C_{1,2}$, $C_{2,1}$, $C_{3,3}$
Group 3: $C_{1,1}$, $C_{2,3}$, $C_{3,2}$ Further, when the code transmission section 613 stores an ECC code in the FF array 615, the code transmission section 613 moves the pieces of bit information of an ECC code, stored in the cells in each column of the FF array 615, to the cells in the next column in synchronization with the clock, and outputs the pieces of bit information stored in the cells $C_{1,3}$, $C_{2,3}$, and $C_{3,3}$ in the last column to different signal lines of the signal line group 132, respectively.

Next, operation of the signal transmission circuit 610 according to the present embodiment will be described.

To the signal transmission circuit 610, time series signals as shown in FIG. 3 are input. The data buffer section 611 of the signal transmission circuit 610 serially inputs the words input in the order as shown in FIG. 3, to the two FF arrays 614 in synchronization with the clock. Then, when the data buffer section 611 inputs data of 3 words to the two FF arrays 614, after outputting the bits of the entire cells in the two FF arrays 614 to the code generation section 612, the data buffer section 611 serially inputs data of 3 words to the two FF arrays 614 again. Along with the inputting, the words output from the two FF arrays 614 are serially output to the signal line group 131-1 and the signal line group 131-2. In synchronization with the outputting, ECC codes are serially output from the FF array 615 of the code transmission section 613 to the signal line group 132, as described below.

Figure 11:
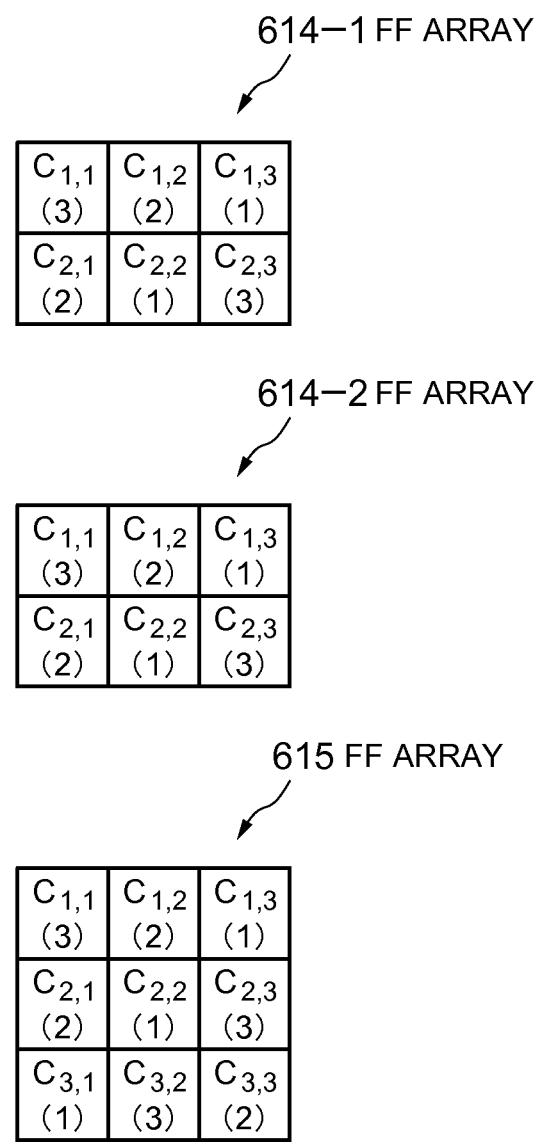
FIG. 11 is an illustration of operation of the signal transmission circuit according to the sixth exemplary embodiment of the present invention.

On the other hand, each time data of 3 words is input to the two FF arrays 614, the code generation section 612 reads the data of the 3 words from the two FF arrays 614, divides the data into 3 groups each having a 4-bit length as shown in FIG. 11, generates ECC codes of a total of 9 bits for correcting errors in the information bits belonging to the respective groups, and outputs them to the code transmission section 613. Then, the code transmission section 613 stores the 9-bit ECC codes for the 3 groups in the FF array 615 in the format as shown in FIG. 11, and outputs the ECC codes from the FF array 615 in synchronization with the clock. The ECC codes output from the FF array 615 are serially output to the signal line group 132.

FIG. 12 is a time series of words and ECC codes output from the data buffer section 611 and the code transmission section 612 to the signal line groups. As shown in FIG. 12, in the present embodiment, the bits constituting a code word are two-dimensionally arranged with respect to the parallel transmission direction and the time direction of the signal line group for each power bank, and the bits output at the same time and the bits output to the same signal line are mere 1 bit per code word. Accordingly, it is possible to ensure error correction capability with respect to both simultaneous switching errors and multiple errors on a particular signal line.

Further, in the present embodiment, in units of the predetermined number of words (in this embodiment, in units of 3 words), the information bits of such number of words and the entire bits of the ECC codes for the words can be transmitted. As such, the present embodiment is particularly suitable for transmission of burst data.

Seventh Exemplary Embodiment

Figure 13:
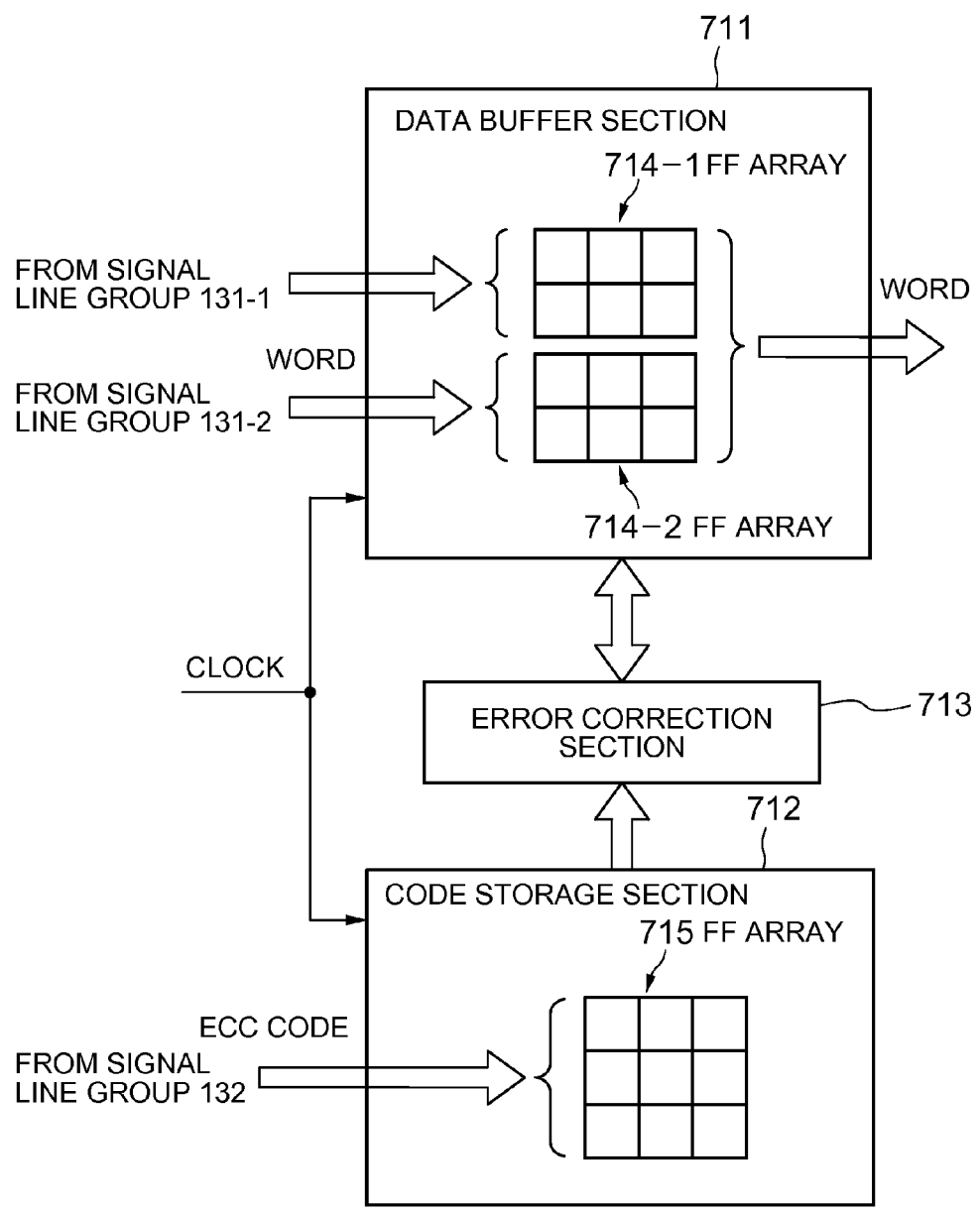
FIG. 13 is a block diagram showing a signal reception circuit according to a seventh exemplary embodiment of the present invention.

Referring to FIG. 13, a signal reception circuit 710 according to a seventh exemplary embodiment includes a data buffer section 711, a code storage section 712, and an error correction section 713. Hereinafter, the configuration of each of the sections will be described using, as an example, a hamming code in which the number of bits of a word is 4 bits and the number of bits of an ECC code is 3 bits. Further, it is assumed that the signal line group 131 connected with the signal reception circuit 710 is divided into a signal line group 131-1 belonging to a power bank A and a signal line group 131-2 belonging to a power bank B, and that the signal line group 132 connected with the code reception section 712 belongs to another power bank C.

The data buffer section 711 includes an FF array 714-1 associated with the signal line group 131-1 and an FF array 714-2 associated with the signal line group 131-2. Each of the FF arrays 714 includes 3×2 (=1/word length) pieces of cells. Each cell is formed of one flip-flop. The data buffer section 711 receives words in synchronization with the clock. The respective bits of each word, input to the data buffer section 711, are input to the cells $C_{1,1}$ and $C_{2,1}$ in the first columns of the respective rows of the two FF arrays 714. In this step, the bit information stored in each cell is moved to a cell in the next column, and the pieces of bit information stored in the cells $C_{1,3}$ and $C_{2,3}$ in the last columns are output to the signal line groups 131-1 and 131-2. As such, each row of the two FF arrays 714 constitutes a shift register. Further, the pieces of bit information stored in the cells of the two FF arrays 714 can be read in parallel. In the present embodiment, every 3 clocks, a total of 6 bits are read from the entire cells for each of the two FF arrays 714 by the error correction section 713.

The code storage section 712 includes an FF array 715 having 3×3 pieces of cells. Each cell is formed of one flip-flop. To the code storage section 712, an ECC code is input from the signal line group 132 in synchronization with the clock. The respective bits of the ECC code, input to the code storage section 712, are input to the cells $C_{1,1}$, $C_{2,1}$, and $C_{3,1}$ in the first column of the respective rows of the FF array 715. In this step, the bit information stored in each cell is moved to a cell in the next column, and the pieces of bit information stored in the cells $C_{1,3}$, $C_{2,3}$, and $C_{3,3}$ in the last column are discarded. As such, each row of the FF array 715 constitutes a shift register. Further, the pieces of bit information stored in the cells of the FF array 715 can be read in parallel. In the present embodiment, every 3 clocks, a total of 9 bits are read from the entire cells of the FF array 715 by the error correction section 713.

The error correction section 713 has a function of reading the information bits and the ECC code bits of 3 code words in total from the FF arrays 714 and the FF array 715, a function of correcting the bit string in which an error is corrected by an ECC code using the ECC code for each of the code words, and a function of writing the corrected bit string to the original cells of the FF arrays 714. The error correction section 713 performs this processing within one clock.

Next, operation of the signal reception circuit 710 according to the present embodiment will be described.

To the signal reception circuit 710, time series signals as shown in FIG. 12 are input via the signal line group 130. The data buffer section 711 and the code storage section 712 of the signal reception circuit 710 serially input the bit strings, input in the order as shown in FIG. 12, to the FF arrays 714 and 715 in synchronization with the clock.

Every 3 clocks, that is, each time a total of 3 code words including 3 words and the ECC codes thereof are stored in the FF arrays 714 and the FF array 715, the error correction section 713 reads the information bits and the ECC code bits of the 3 code words from the FF arrays 714 and the FF array 715, and for each code word, the error correction section 713 corrects the bit string in which an error is to be corrected by an ECC code using the ECC code, and writes the corrected bit string to the original cells of the FF arrays 714.

The above-described processing by the error correction section 713 is performed within one clock. Then, in synchronization with the clock, the next 3 code words are serially input from the signal line groups to the FF arrays 714 and the FF array 715, and along with it, the words in which the errors have been corrected are serially output from the FF arrays 714 and then output to the outside.

According to the present embodiment, it is possible to provide a signal reception circuit which can be used in combination with the signal transmission circuit of the sixth exemplary embodiment.

Eighth Exemplary Embodiment

Figure 14:
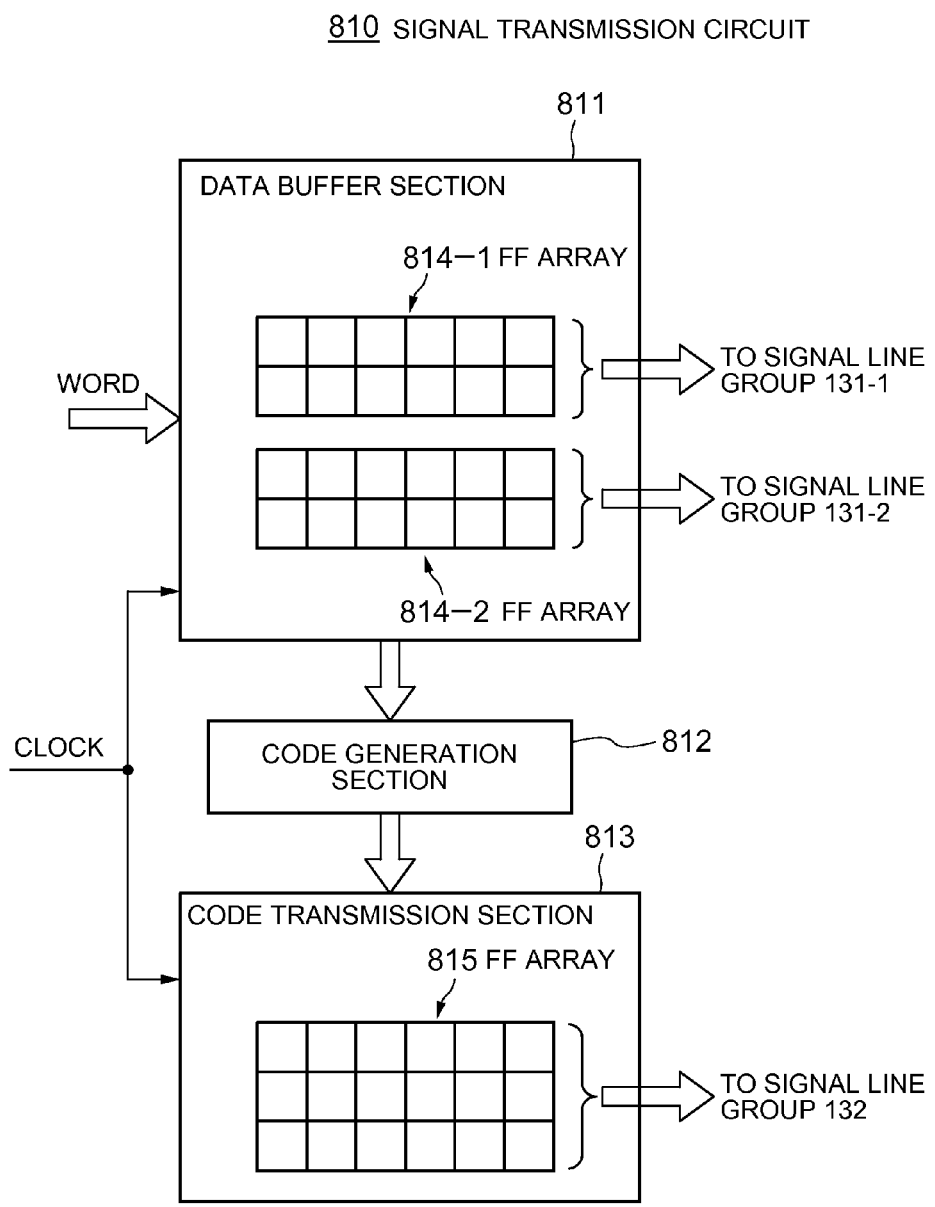
FIG. 14 is a block diagram showing a signal transmission circuit according to an eighth exemplary embodiment of the present invention.

Referring to FIG. 14, a signal transmission circuit 810 according to an eighth exemplary embodiment includes a data buffer section 811, a code generation section 812, and a code transmission section 813. Hereinafter, the configuration of each of the sections will be described using, as an example, a hamming code in which the number of bits of a word is 4 bits and the number of bits of an ECC code is 3 bits. Further, it is assumed that the signal line group 131 connected with the signal transmission circuit 810 is divided into a signal line group 131-1 belonging to a power bank A and a signal line group 131-2 belonging to a power bank B, and that the signal line group 132 connected with the code transmission section 813 belongs to another power bank C.

The data buffer section 811 includes an FF array 814-1 associated with the signal line group 131-1 and an FF array 814-2 associated with the signal line group 131-2. Each of the FF arrays 814 includes 6×2 pieces of cells. Each cell is formed of one flip-flop. The data buffer section 811 receives words in synchronization with the clock. The respective bits of each word input to the data buffer section 811 are input to the cells $C_{1,1}$ and $C_{2,1}$ in the first columns of the respective rows of the two FF arrays 814. In this step, the bit information stored in each cell is moved to a cell in the next column, and the pieces of bit information stored in the cells $C_{1,6}$ and $C_{2,6}$ in the last columns are output to the signal line groups 131-1 and 131-2. As such, each row of the two FF arrays 814 constitutes a shift register. Further, the pieces of bit information stored in the cells of the two FF arrays 814 can be read in parallel. In the present embodiment, every 6 clocks, a total of 12 bits are read from the entire cells for each of the two FF arrays 814 by the code generation section 812.

The code generation section 812 has a function of, for each of the FF arrays 814, reading information bits from 12 pieces of cells of the FF array 814, and a function of dividing the bit string of the 12 bits into 6 groups each having a 2-bit length. When dividing the bit string, the code generation section 812 divides the bit string in such a manner that a combination of any 2 bits in any bit string are neither a combination of bits stored in cells in the same row of the same FF array 814 nor a combination of bits stored in cells in the same column of the same FF array 814. Specifically, in the present embodiment, it is divided into the groups of cells as shown below (see FIG. 15).

Group 1: $C_{1,6}, C_{2,4}$
Group 2: $C_{1,5}, C_{2,3}$
Group 3: $C_{1,4}, C_{2,2}$
Group 4: $C_{1,3}, C_{2,1}$
Group 5: $C_{1,2}, C_{2,6}$
Group 6: $C_{1,1}, C_{2,5}$ Further, for each group, the code generation section 812 has a function of generating a 3-bit ECC code for correcting errors of 4 bits in total belonging to the same group of the two FF arrays 814. ECC codes having a total of 18 bits for the groups generated by the code generation section 812 are output to the code transmission section 813.

The code transmission section 813 includes an FF array 815 having 3×6 pieces of cells. Each cell is formed of one flip-flop. The code transmission section 813 inputs ECC codes, having a total of 18 bits for the 6 groups generated by the code generation section 812, to the 18 pieces of cells of the FF array 815. When inputting the codes, the code transmission section 813 performs inputting in such a manner that a combination of any 2 bits in the ECC code of the same code word are neither a combination of bits stored in the same row of the FF array 815 nor a combination of bits stored in the same column or in columns adjacent to each other. Specifically, in the present embodiment, they are input as shown below (see FIG. 15).

Group 1: $C_{1,6}, C_{2,4}, C_{3,2}$
Group 2: $C_{1,5}, C_{2,3}, C_{3,1}$
Group 3: $C_{1,4}, C_{2,2}, C_{3,6}$
Group 4: $C_{1,3}, C_{2,1}, C_{3,5}$
Group 5: $C_{1,2}, C_{2,6}, C_{3,4}$
Group 6: $C_{1,1}, C_{2,5}, C_{3,3}$ Further, when the code transmission section 813 stores the ECC codes in the FF array 815, the code transmission section 813 moves the pieces of bit information of the ECC codes, stored in the cells in each column of the FF array 815, to the cells in the next column in synchronization with the clock, and outputs the pieces of bit information stored in the cells $C_{1,6}$, $C_{2,6}$, and $C_{3,6}$ in the last column to different signal lines of the signal line group 132, respectively.

Next, operation of the signal transmission circuit 810 according to the present embodiment will be described.

To the signal transmission circuit 810, time series signals as shown in FIG. 3 are input. The data buffer section 811 of the signal transmission circuit 810 serially inputs the words, input in the order as shown in FIG. 3, to the two FF arrays 814 in synchronization with the clock. Then, when the data buffer section 811 has input data of 6 words in the two FF arrays 814, after outputting the bits of the entire cells in the two FF arrays 814 to the code generation section 812, the data buffer section 811 serially inputs data of 6 words to the two FF arrays 814 again. Along with the inputting, the words output from the two FF arrays 814 are serially output to the signal line group 131-1 and the signal line group 131-2. In synchronization with it, ECC codes are serially output from the FF array 815 of the code transmission section 813 to the signal line group 132, as described below.

Figure 15:
FIG. 15 is an illustration of operation of the signal transmission circuit according to the eighth exemplary embodiment of the present invention.
Figure 15:
Figure 15:

On the other hand, each time data of 6 words is input to the two FF arrays 814, the code generation section 812 reads the data of the 6 words from the FF arrays 814, divides the data into 6 groups each having a 4-bit length as shown in FIG. 15, generates ECC codes of a total of 18 bits for correcting errors in the information bits belonging to the respective groups, and outputs them to the code transmission section 813. Then, the code transmission section 813 stores the 18-bit ECC codes for the 6 groups in the FF array 815 in the format as shown in FIG. 15, and performs outputting from the FF array 815 in synchronization with the clock. The ECC codes output from the FF array 815 are serially output to the signal line group 132.

FIG. 16 is a time series of words and ECC codes output from the data buffer section 811 and the code transmission section 812 to the signal line groups. As shown in FIG. 16, in the present embodiment, the bits constituting a code word are two-dimensionally arranged with respect to the parallel transmission direction and the time direction of a signal line group for each power bank, and the bits output at the same time and the bits output to the same signal line are mere 1 bit per code word. Accordingly, it is possible to ensure error correction capability with respect to both simultaneous switching errors and multiple errors on a particular signal line.

Further, in the present embodiment, for each power bank, the bits constituting the same code word are not output continuously but are output every other bit. As such, even if an error occurs in two continuing words due to huge simultaneous switching noise, as the respective bits belong to different code words, the error can be corrected. While in the present invention outputting is performed every other bit, it is needless to say that the effect can be enhanced with a coding format in which outputting is performed every two bits or every three bits.

Further, in the present embodiment, in units of the predetermined number of words (in this embodiment, in units of 6 words), the information bits of such number of words and the entire bits of the ECC codes for the words can be transmitted. As such, the present embodiment is particularly suitable for transmission of burst data.

Ninth Exemplary Embodiment

Figure 17:
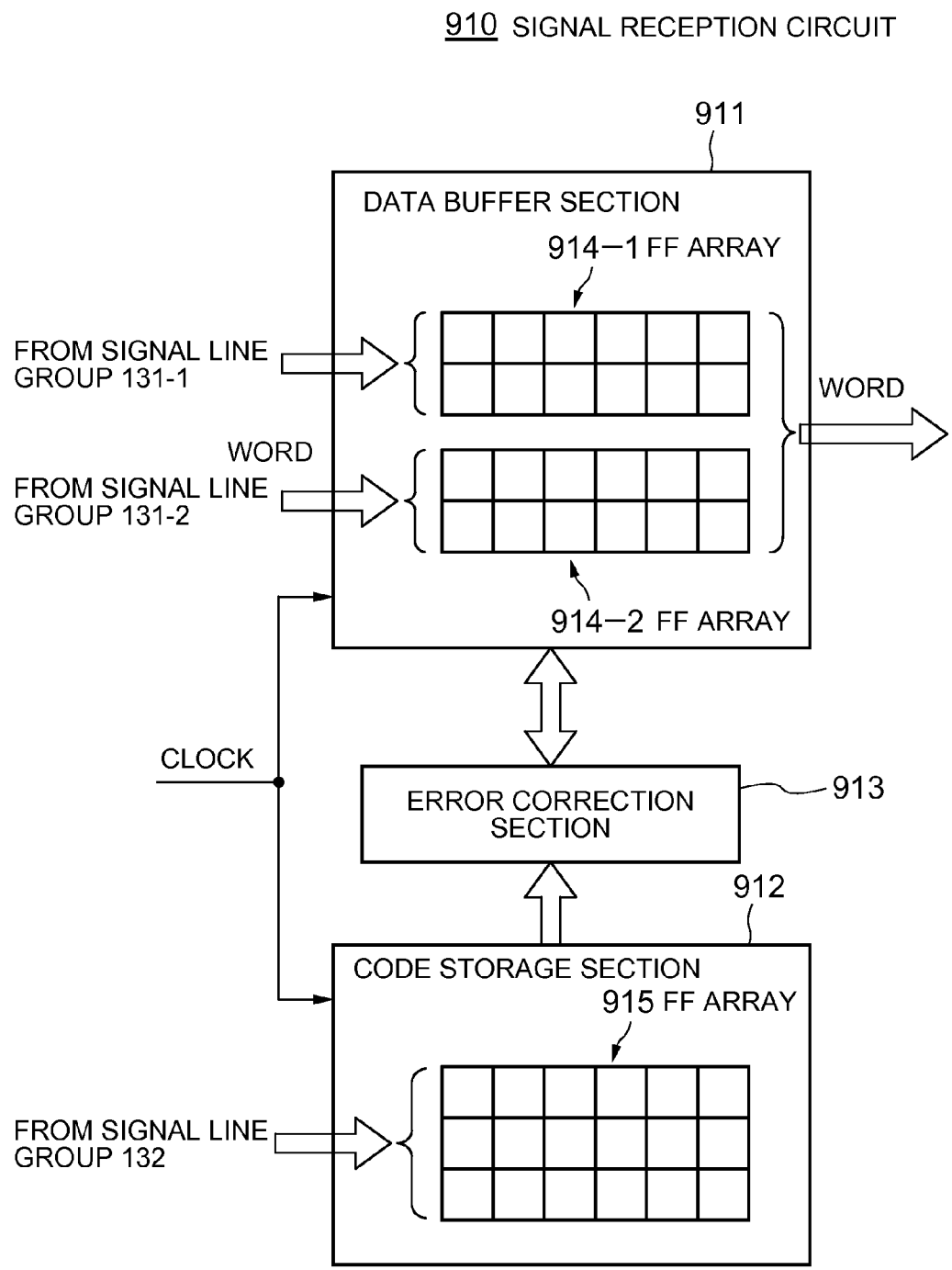
FIG. 17 is a block diagram showing a signal reception circuit according to a ninth exemplary embodiment of the present invention.

Referring to FIG. 17, a signal reception circuit 910 according to a ninth exemplary embodiment of the present invention includes a data buffer section 911, a code storage section 912, and an error correction section 913. Hereinafter, the configuration of each of the sections will be described using, as an example, a hamming code in which the number of bits of a word is 4 bits and the number of bits of an ECC code is 3 bits. Further, it is assumed that the signal line group 131 connected with the signal reception circuit 910 is divided into a signal line group 131-1 belonging to a power bank A and a signal line group 131-2 belonging to a power bank B, and that the signal line group 132 connected with the code reception section 912 belongs to another power bank C.

The data buffer section 911 includes an FF array 914-1 associated with the signal line group 131-1 and an FF array 914-2 associated with the signal line group 131-2. Each of the FF arrays 914 includes 6×2 pieces of cells. Each cell is formed of one flip-flop. The data buffer section 911 receives words in synchronization with the clock. The respective bits of each word, input to the data buffer section 911, are input to the cells $C_{1,1}$ and $C_{2,1}$ in the first columns of the respective rows of the two FF arrays 914. In this step, the bit information stored in each cell is moved to a cell in the next column, and the pieces of bit information stored in the cells $C_{1,6}$ and $C_{2,6}$ in the last column are output to the outside as words. As such, each row of the two FF arrays 914 constitutes a shift register. Further, the pieces of bit information stored in the cells of the two FF arrays 914 can be read and written in parallel. In the present embodiment, every 6 clocks, a total of 12 bits are read from the entire cells for each of the two FF arrays 914 by the error correction section 913.

The code storage section 912 includes an FF array 915 having 6×3 pieces of cells. Each cell is formed of one flip-flop. The code storage section 912 receives an ECC code from the signal line group 132 in synchronization with the clock. The respective bits of the ECC code, input to the code storage section 912, are input to the cells $C_{1,1}$, $C_{2,1}$, and $C_{3,1}$ in the first column of the respective rows of the FF array 915. In this step, the bit information stored in each cell is moved to a cell in the next column, and the pieces of bit information stored in the cells $C_{1,6}$, $C_{2,6}$, and $C_{3,6}$ in the last column are discarded. As such, each row of the FF array 915 constitutes a shift register. Further, the pieces of bit information stored in the cells of the FF array 915 can be read in parallel. In the present embodiment, every 6 clocks, a total of 18 bits are read from the entire cells of the FF array 915 by the error correction section 913.

The error correction section 913 has a function of reading information bits and ECC code bits of 6 code words in total from the FF arrays 914 and the FF array 915, a function of correcting the bit string in which an error is to be corrected by an ECC code using the ECC code for each of the code words, and a function of writing the corrected bit string to the original cells of the FF arrays 914. The error correction section 913 performs this processing within one clock.

Next, operation of the signal reception circuit 910 according to the present embodiment will be described.

To the signal reception circuit 910, time series signals as shown in FIG. 16 are input via the signal line group 130. The data buffer section 911 and the code storage section 912 of the signal reception circuit 910 serially input the bit strings, input in the order as shown in FIG. 16, to the FF arrays 914 and the FF array 915 in synchronization with the clock.

Every 6 clocks, that is, each time a total of 6 code words including 6 words and the ECC codes thereof are stored in the FF arrays 914 and the FF array 915, the error correction section 913 reads the information bits and the ECC code bits of the 6 code words in total from the FF arrays 914 and the FF array 915, and for each code word, the error correction section 913 corrects the bit string in which an error is to be corrected by an ECC code using the ECC code, and writes the corrected bit string to the original cells of the FF arrays 914.

The processing by the error correction section 913 is performed within one clock. Then, in synchronization with the clock, the next 6 code words are serially input from the signal line group to the FF arrays 914 and the FF array 915, and along with it, the words in which the errors have been corrected are serially output from the FF arrays 914 and then output to the outside.

According to the present embodiment, it is possible to provide a signal reception circuit which can be used in combination with the signal transmission circuit of the eighth exemplary embodiment.

Tenth Exemplary Embodiment

Figure 18:
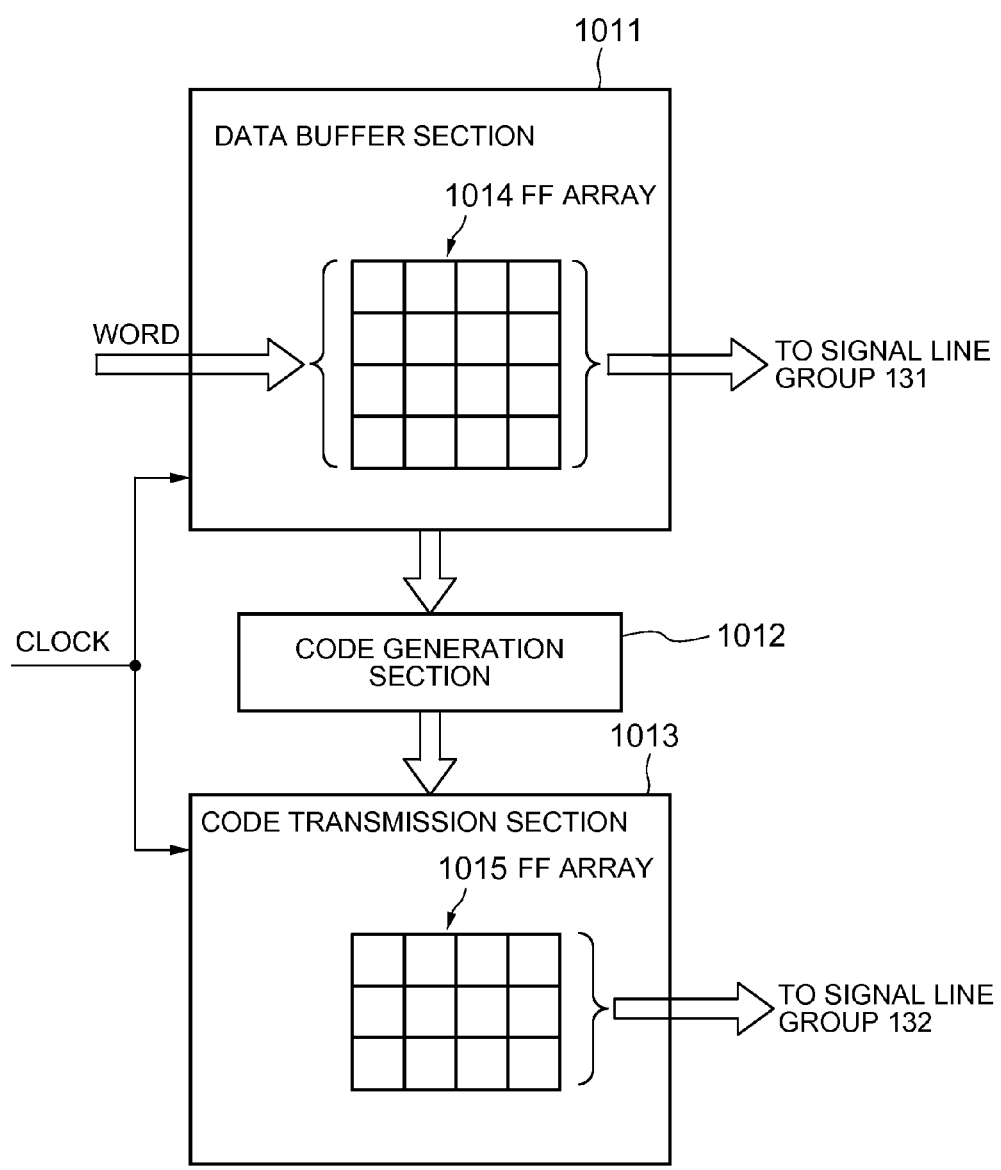
FIG. 18 is a block diagram showing a signal transmission circuit according to a tenth exemplary embodiment of the present invention.

Referring to FIG. 18, a signal transmission circuit 1010 according to a tenth exemplary embodiment of the present invention includes a data buffer section 1011, a code generation section 1012, and a code transmission section 1013. Hereinafter, the configuration of each of the sections will be described using, as an example, a hamming code in which the number of bits of a word is 4 bits and the number of bits of an ECC code is 3 bits. Further, it is assumed that the signal line group 131 connected with the signal transmission circuit 1010 belongs to a power bank A and the signal line group 132 connected with the code transmission section 1013 belongs to another power bank B.

The data buffer section 1011 includes an FF array 1014 having 4×4 pieces of cells. Each cell is formed of one flip-flop. The data buffer section 1011 receives words in synchronization with the clock. The respective bits of each word, input to the data buffer section 1011, are input to the cells $C_{1,1}$, $C_{2,1}$, $C_{3,1}$, and $C_{4,1}$ in the first column of the respective rows of the FF array 1014. In this step, the bit information stored in each cell is moved to a cell in the next column. As such, each row of the FF array 1014 constitutes a shift register. Further, the pieces of bit information stored in the cells of the FF array 1014 can be read in parallel. In the present embodiment, after data of 4 words is stored in the FF array 1014, reading is performed twice. In the first reading, in order to generate an ECC code, reading is performed on a per row basis of the FF array 1014 in such a manner that the bits stored in the cells are read in parallel as one group, and the readout bits are output to the code generation section 1012. As such, as shown in FIG. 19, the bit string of the cells $C_{1,1}$, $C_{1,2}$, $C_{1,3}$, and $C_{1,4}$ in the first row of the FF array 1014 is read as a group 1, the bit string of the cells $C_{2,1}$, $C_{2,2}$, $C_{2,3}$, and $C_{2,4}$ in the second row is read as a group 2, the bit string of the cells $C_{3,1}$, $C_{3,2}$, $C_{3,3}$, and $C_{3,4}$ in the third row is read as a group 3, and the bit string of the cells $C_{4,1}$, $C_{4,2}$, $C_{4,3}$, and $C_{4,4}$ in the fourth row is read as a group 4, and they are output to the code generation section 1012. In the second reading, in order to output the data to the signal line 131, reading is performed on a per column basis of the FF array 1014 in such a manner that the bits stored in the cells are read as a word, and the readout words are output to different signal lines of the signal line group 131, respectively.

The code generation section 1012 has a function of reading information bits on a per row basis from the FF array 1014, and a function of, for each bit string read by the row, generating an ECC code of a 3-bit length for correcting an error in the bit string. ECC codes having a total of 12 bits, for the 4 code words generated by the code generation section 1012, are output to the code transmission section 1013.

The code transmission section 1013 includes an FF array 1015 having 3×4 pieces of cells. Each cell is formed of one flip-flop. The code transmission section 1013 inputs the ECC codes having a total of 12 bits for the 4 code words generated by the code generation section 1012, to the 12 pieces of cells of the FF array 1015. When inputting the codes, the code transmission section 1013 performs inputting in such a manner that a combination of any 2 bits in the ECC code of the same code word are neither a combination of bits to be input in the same row of the FF array 1015 nor a combination of bits to be input in the same column. Specifically, in the present embodiment, the ECC codes of the respective groups are input to the cells as shown below (see FIG. 19).

Group 1: $C_{1,4}$, $C_{2,3}$, $C_{3,2}$
Group 2: $C_{1,3}$, $C_{2,2}$, $C_{3,1}$
Group 3: $C_{1,2}$, $C_{2,1}$, $C_{3,4}$
Group 4: $C_{1,1}$, $C_{2,4}$, $C_{3,3}$ Further, when the code transmission section 1013 stores the ECC codes in the FF array 1015, the code transmission section 1013 moves the bit information of the ECC codes, stored in the cells in each column of the FF array 1015, to the cells in the next column in synchronization with the clock, and outputs the bit information stored in the cells $C_{1,4}$, $C_{2,4}$, $C_{3,4}$, and $C_{4,4}$ in the last column to different signal lines of the signal line group 132, respectively.

Next, operation of the signal transmission circuit 1010 according to the present embodiment will be described.

To the signal transmission circuit 1010, time series signals as shown in FIG. 3 are input. The data buffer section 1011 of the signal transmission circuit 1010 serially inputs the words, input in the order as shown in FIG. 3, to the FF array 1014 in synchronization with the clock. Then, when the data buffer section 1011 inputs the data of 4 words to the FF array 1014, the data buffer section 1011 outputs the bit string of each row as a bit string of one group to the code generation section 1012.

The code generation section 1012 generates an ECC code for correcting an error in the bit string of each row (each group) of the FF array 1014, and outputs it to the code transmission section 1013. The code transmission section 1013 inputs the ECC code of each group to the FF array 1015 by means of an arrangement method as shown in FIG. 19.

Then, the FF array 1014 in the data buffer section 1011 and the FF array 1015 in the code transmission section 1013 are shifted by 4 clocks in the column direction in synchronization with the clock. Thereby, the next 4 words are serially input to the FF array 1014, and a total of 16 bits of the 4 code words stored in the FF array 1014 are serially output to the signal line group 131 in word units, and ECC codes having a total of 12 bits for the 4 code words stored in the FF array 1015 are output in units of 3 bits to the signal line group 132 in parallel.

FIG. 20 is a time series of words and ECC codes output from the signal transmission circuit 1010 of the present embodiment to the signal line groups. As shown in FIG. 20, in the present embodiment, the bits output at the same time to a signal line group for each power bank are mere 1 bit per code word. Accordingly, even if errors occur in all bits on a particular signal line group due to simultaneous switching noise, as the respective bits belong to different code words, the errors can be corrected.

Further, in the present embodiment, the bits of the ECC codes output to the same signal line are mere 1 bit per code word. Accordingly, it is possible to ensure error correction capability with respect to multiple errors on a particular signal line.

In the present embodiment, in units of the predetermined number of words (in this embodiment, in units of 4 words), the information bits of such number of words and the entire bits of the ECC codes for the words can be transmitted. As such, the present embodiment is particularly suitable for transmission of burst data.

Eleventh Exemplary Embodiment

Figure 21:
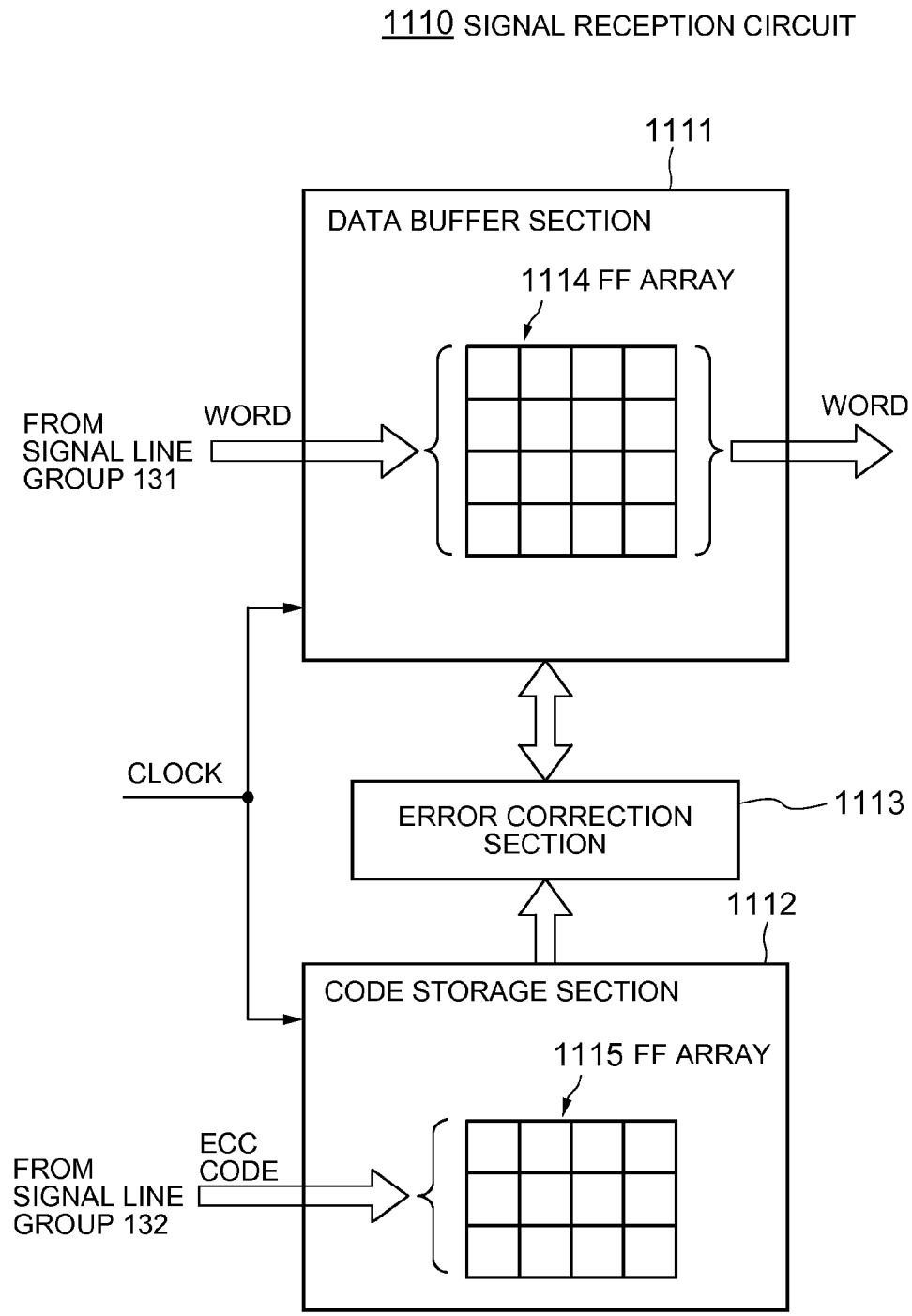
FIG. 21 is a block diagram showing a signal reception circuit according to an eleventh exemplary embodiment of the present invention.

Referring to FIG. 21, a signal reception circuit 1110 according to an eleventh exemplary embodiment of the present invention includes a data buffer section 1111, a code storage section 1112, and an error correction section 1113. Hereinafter, the configuration of each of the sections will be described using, as an example, a hamming code in which the number of bits of a word is 4 bits and the number of bits of an ECC code is 3 bits. Further, it is assumed that the signal line group 131 connected with the signal reception circuit 1110 belongs to a power bank A, and a signal line group 132 connected with the code storage section 1112 belongs to another power bank B.

The data buffer section 1111 includes an FF array 1114 having 4×4 pieces of cells. Each cell is formed of one flip-flop. The data buffer section 1111 receives words from the signal line group 131 in synchronization with the clock. The respective bits of each word, input to the data buffer section 1111, are input to the cells $C_{1,1}, C_{2,1}, C_{3,1}$, and $C_{4,1}$ in the first column of the respective rows of the FF array 1114. In this step, the bit information stored in each cell is moved to a cell in the next column. As such, each row of the FF array 1014 constitutes a shift register. Further, the pieces of bit information stored in the cells of the FF array 1114 can be read and written in parallel. In the present embodiment, after data of 4 words is stored in the FF array 1114, reading is performed twice. In the first reading, in order to perform error checking and correction, reading is performed by the row of the FF array 1114 in such a manner that the bits stored in the cells are read in parallel as one group, and the readout bits are output to the error correction section 1113. In the second reading, in order to output the received data to the outside, reading is performed by the column of the FF array 1114 in such a manner that the bits stored in the cells are read as a word and output to the outside. Further, if error correction is required, writing to the FF array 1114 is performed between the first reading and the second reading.

The code storage section 1112 includes an FF array 1115 having 4×4 pieces of cells. Each cell is formed of one flip-flop. The code storage section 1112 receives an ECC code from the signal line group 132 in synchronization with the clock. The respective bits of the ECC code, input in the code storage section 1112, are input to the cells $C_{1,1}, C_{2,1}$, and $C_{3,1}$ in the first column of the respective rows of the FF array 1115. In this step, the bit information stored in each cell is moved to a cell in the next column. As such, each row of the FF array 1115 constitutes a shift register. Further, the pieces of bit information stored in the cells of the FF array 1115 can be read in parallel. In the present embodiment, after ECC codes for 4 code words have been stored in the FF array 1115, the bits stored in the entire cells of the FF array 1115 are read and output to the error correction section 1113.

The error correction section 1113 has a function of reading information bits and ECC code bits for a total of 6 code words from the FF array 1114 and the FF array 1115, a function of, for each of the code words, correcting the bit string in which an error is to be corrected by an ECC code using the ECC code, and a function of writing back the corrected bit string to the original cells of the FF array 1114. The error correction section 1113 performs this processing within one clock.

Next, operation of the signal reception circuit 1110 according to the present embodiment will be described.

To the signal reception circuit 1110, time series signals as shown in FIG. 20 are input via the signal line group 130. The data buffer section 1111 and the code storage section 1112 of the signal reception circuit 1110 serially input the bit strings, input in the order as shown in FIG. 20, to the FF array 1114 and the FF array 1115 in synchronization with the clock.

Every 6 clocks, that is, each time a total of 6 code words including 6 words and the ECC codes thereof are stored in the FF array 1114 and the FF array 1115, the error correction section 1113 reads information bits and ECC code bits for a total of 6 code words from the FF array 1114 and the FF array 1115, and for each code word, the error correction section 1113 corrects the bit string in which an error is to be corrected by an ECC code using the ECC code, and writes back the corrected bit string to the original cells of the FF array 1114.

The processing by the error correction section 1113 is performed within one clock. Then, in synchronization with the clock, the next 6 code words are serially input from the signal line group to the FF array 1114 and the FF array 1115, and along with it, the words in which the errors have been corrected are serially output from the FF array 1114 and then output to the outside.

According to the present embodiment, it is possible to provide a signal reception circuit which can be used in combination with the signal transmission circuit of the tenth exemplary embodiment.

Twelfth Exemplary Embodiment

Figure 22:
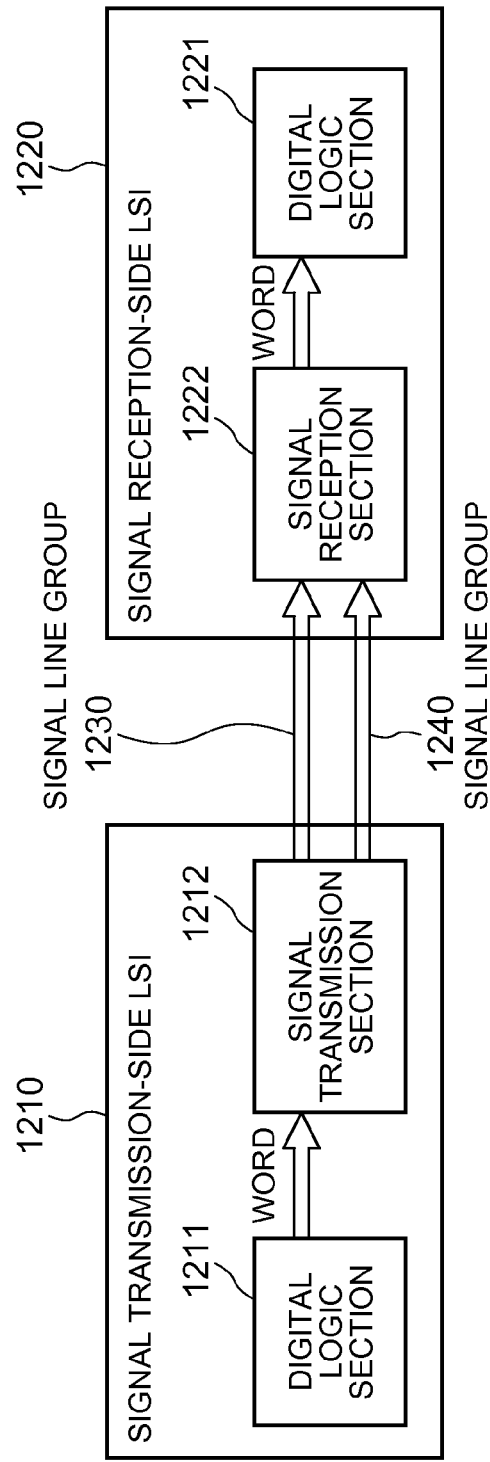
FIG. 22 is a block diagram showing a signal transmission/reception circuit according to a twelfth exemplary embodiment of the present invention.

Referring to FIG. 22, a signal transmission/reception circuit 1200 according to a twelfth exemplary embodiment of the present invention includes a signal transmission-side LSI 1210, and a signal reception-side LSI 1220 connected with the signal transmission-side LSI 1210 via a signal line group 1230 and a signal line group 1240. The signal line group 1230 may be a data bus for example, including a plurality of signal lines. The signal line group 1240 includes a plurality of signal lines for transmitting ECC codes.

The signal transmission-side LSI 1210 includes a digital logic section 1211 and a signal transmission section 1212. The signal reception-side LSI 1220 includes a digital logic section 1221 and a signal reception section 1222. Each of the digital logic sections 1211 and 1221 is formed of an MPU (Micro-Processing Unit) or the like. When the digital logic section 1211 transmits data to the digital logic section 1221, the digital logic section 1211 outputs data in word units to the signal transmission section 1212.

The signal transmission section 1212 has a function of serially receiving a plurality of words from the digital logic section 1211, from the words, generating a plurality of code words each formed of information bits, having the same number of bits as those of the word, and an ECC code, and transmitting them to the signal reception circuit 1220 via the signal line groups 1230 and 1240. The signal transmission section 1212 may be formed of the signal transmission circuit according to the first, second, fourth, sixth, eighth, or the tenth exemplary embodiment described above.

The signal reception section 1222 has a function of receiving a plurality of code words from the signal transmission circuit 1210 via the signal line groups 1230 and 1240, and for each of the received code words, performing error correction of the information bits using the ECC code, and outputting the data constituted of the information bits in which the errors have been corrected to the digital logic section 1222 in word units. The signal reception section 1222 may be formed of the signal reception circuit according to the first, third, fifth, seventh, ninth, and eleventh exemplary embodiment described above.

Thirteenth Exemplary Embodiment

Figure 23:
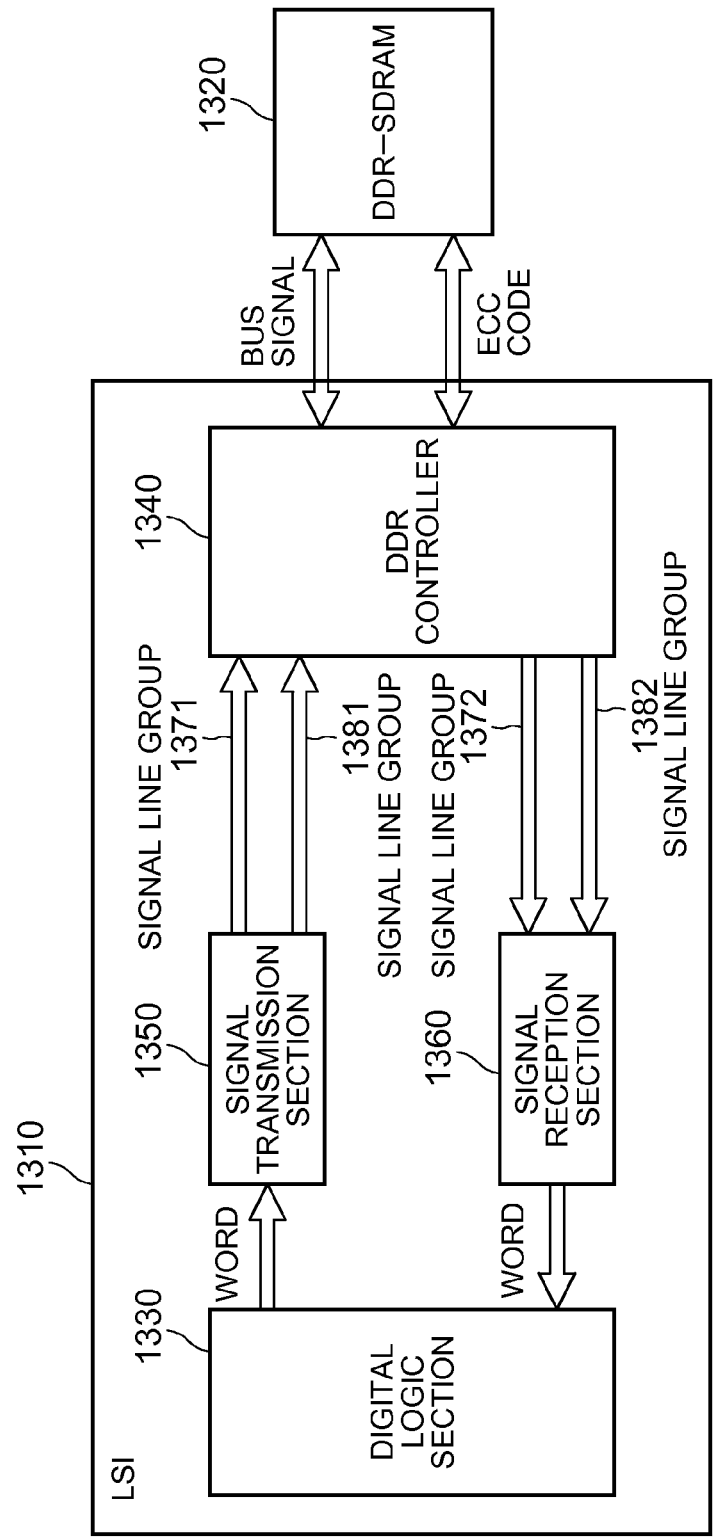
FIG. 23 is a block diagram showing a signal transmission/reception circuit according to a thirteenth exemplary embodiment of the present invention.

Referring to FIG. 23, a signal transmission/reception circuit 1300 according to a thirteenth exemplary embodiment of the present invention includes an LSI 1310, and a DDR-SDRAM (Double-Data-Rate Synchronous Dynamic Random Access Memory) 1320 which transmits and receives bus signals and ECC codes with the LSI 1310. Further, the LSI 1310 includes a digital logic section 1330 formed of an MPU or the like, a DDR controller 1340, and a signal transmission section 1350 and a signal reception section 1360 provided between the digital logic section 1330 and the DDR controller 1340.

The signal transmission section 1350 has a function of serially receiving a plurality of words from the digital logic section 1330, generating, from the words, a plurality of code words each formed of information bits, having the same number of bits as those of the word, and an ECC code, and transmitting them to the DDR controller 1340 via signal line groups 1371 and 1381. The signal transmission section 1350 may be formed of the signal transmission circuit according to the first, second, fourth, sixth, eighth, or the tenth exemplary embodiment described above.

The signal reception section 1360 has a function of receiving a plurality of code words from the DDR controller 1340 via signal line groups 1372 and 1382, and for each of the received code words, performing error correction of the information bits using the ECC code, and outputting the data constituted of the information bits in which the errors have been corrected to the digital logic section 1330 in word units. The signal reception section 1360 may be formed of the signal reception circuit according to the first, third, fifth, seventh, ninth, and eleventh exemplary embodiment described above.

While the present invention has been described with reference to the exemplary embodiments, the present invention is not limited to these exemplary embodiments, and various additions and changes may be made therein. Further, in order to simplify the description, while the respective exemplary embodiments have been described based on an example of adding a 3-bit ECC code to a 4-bit word, the number of bits of a word is not limited to 4 bits. Any number of bits, including 8 bits, 16 bits, 32 bits, and 64 bits may be acceptable. Further, an ECC code may also have any number of bits, according to the number of bits of the word and the error checking and correcting capability.

INDUSTRIAL APPLICABILITY

The present invention is applicable to the overall field of transmitting and receiving signals in parallel data by adding ECC codes, between LSIs, between an LSI and a RAM, or the like.

The whole or part of the exemplary embodiments disclosed above can be described as, but not limited to, the following supplementary notes.

(Supplementary Note 1)

A signal transmission/reception circuit including a signal transmission circuit and a signal reception circuit connected with each other by a first signal line group and a second signal line group, wherein the signal transmission circuit includes:

a transmission-side data buffer section, including k pieces of transmission-side shift registers each having k stages where the number of bits of a word is k, that inputs respective bits of an input word to the k pieces of transmission-side shift registers, and outputs respective bits, output from the k pieces of transmission-side shift registers, to different signal lines of the first signal line group, respectively;

a code generation section that, each time a new word is input to the transmission-side data buffer section, generates an m-bit error checking and correcting code for correcting an error in a bit string having a total of k bits, the bit string being formed by reading 1 bit each from different stages of the k pieces of transmission-side shift registers; and a code transmission section, including m pieces of transmission-side shift registers each having k+1 stages, k+2 stages, . . . or k+m stages, that inputs respective bits of the error checking and correcting code generated by the code generation section to the m pieces of transmission-side shift registers, and outputs respective bits, output from the m pieces of transmission-side shift register, to different signal lines of the second signal line group, respectively, and the signal reception circuit includes:

a reception-side data buffer section, including k pieces of reception-side shift registers each having k+m stages, that inputs respective bits of a word received from the first signal line group to the k pieces of reception-side shift registers, and outputs respective bits output from the k pieces of reception-side shift registers;

a reception-side code buffer section, including m pieces of reception-side shift registers each having 1 stage, 2 stages, . . . or m stages, that inputs respective bits received from the second signal line group to the m pieces of reception-side shift registers; and an error correction section that, when the entire bits of an error checking and correcting code and the entire bits of a bit string in which an error is to be corrected by the error checking and correction code, included in the same code word, are stored in both the k pieces of reception-side shift registers and the m pieces of reception-side shift registers, reads the error checking and correcting code of the code word from the m pieces of reception-side shift registers, and with use of the readout error checking and correcting code, performs error correction of the bit string in which the error is to be corrected by the error checking and correcting code stored in the k pieces of reception-side shift registers.

(Supplementary Note 2)

A signal transmission/reception circuit including a signal transmission circuit and a signal reception circuit connected with each other by a first signal line group and a second signal line group, wherein the signal transmission circuit includes:

a transmission-side data buffer section, including k pieces of transmission-side shift registers each having 2k stages where the number of bits of a word is k, that inputs respective bits of an input word to the k pieces of transmission-side shift registers, and outputs respective bits, output from the k pieces of transmission-side shift registers, to different signal lines of the first signal line group, respectively;

a code generation section that, each time 2k pieces of words are input to the k pieces of transmission-side shift registers, reads the 2k pieces of words stored in the k pieces of transmission-side shift registers by dividing it into 2k pieces of k-bit bit strings in such a manner that a combination of any 2 bits in any bit string are neither a combination of bits stored in the same transmission-side shift register nor a combination of bits in the same stages of the k pieces of transmission-side shift registers, and generates 2k pieces of m-bit error checking and correcting codes for correcting errors in the readout 2k pieces of bit strings; and a code transmission section, including m pieces of transmission-side shift registers each having 2k stages, that each time 2k pieces of error checking and correcting codes are generated by the code generation section, stores respective bits of the 2k pieces of error checking and correcting codes in the m pieces of transmission-side shift registers in such a manner that a combination of any 2 bits in any error checking and correcting code are neither a combination of bits to be stored in the same transmission-side shift register nor a combination of bits to be stored in the same stages of the m pieces of transmission-side shift registers, and that the stages of the m pieces of transmission-side shift registers storing the respective bits of the error checking and correcting code are not the same as the stages of the k pieces of transmission-side shift registers storing the bit string in which the error is to be corrected by the error checking and correcting code, and then performs outputting of the m pieces of transmission-side shift registers in synchronization with the k pieces of transmission-side shift registers, and outputs the respective bits, output from the m pieces of transmission-side shift register, to different signal lines of the second signal line group, respectively, and the signal reception circuit includes:

a reception-side data buffer section, including k pieces of reception-side shift registers each having 2k stages, that inputs respective bits of a word received from the first signal line group to the k pieces of reception-side shift registers, and outputs respective bits output from the k pieces of reception-side shift registers;

a reception-side code buffer section, including m pieces of reception-side shift registers each having 2k stages, that inputs respective bits received from the second signal line group to the m pieces of reception-side shift registers; and an error correction section that, when the entire bits of error checking and correcting codes and the entire bits of bit strings in which the errors are to be corrected by the error checking and correcting codes, included in the 2k pieces of code words, are stored in both the k pieces of reception-side shift registers and the m pieces of reception-side shift registers, reads the error checking and correcting code of each of the code words from the m pieces of reception-side shift registers, and with use of the readout error checking and correcting code, performs error correction of the bit string in which the error is to be corrected by the error checking and correcting code of each of the code words stored in the k pieces of reception-side shift registers.

REFERENCE NUMERALS 100 signal transmission/reception circuit
110 signal transmission circuit
111 data buffer section
112 code generation section
113 code transmission section
120 signal reception circuit
121 data buffer section
122 code buffer section
123 error correction section
130, 131, 132 signal line group

The invention claimed is:

1. A signal transmission/reception circuit comprising a signal transmission circuit and a signal reception circuit connected with each other by a first signal line group and a second signal line group, wherein the signal transmission circuit comprises:

a transmission-side data buffer section comprising k transmission-side shift registers each having k stages where the number of bits of a word is k, that inputs respective bits of an input word to the k transmission-side shift registers, and outputs respective bits, output from the k transmission-side shift registers, to different signal lines of the first signal line group, respectively;

a code generation section that, each time a new word is input to the transmission-side data buffer section, generates an m-bit error checking and correcting code for correcting an error in a bit string having a total of k bits, the bit string being formed by reading 1 bit each from different stages of the k transmission-side shift registers; and a code transmission section, comprising m transmission-side shift registers each having k+m stages, that inputs respective bits of the error checking and correcting code generated by the code generation section to the m transmission-side shift registers, and outputs respective bits from the m transmission-side shift registers to different signal lines of the second signal line group, respectively, and the signal reception circuit comprises:

a reception-side data buffer section, comprising k reception-side shift registers each having k+m stages, that inputs respective bits of a word received from the first signal line group to the k reception-side shift registers, and outputs respective bits from the k reception-side shift registers;

a reception-side code buffer section, comprising m reception-side shift registers each having m stages, that inputs respective bits received from the second signal line group to the m reception-side shift registers; and an error correction section that, when an entire error checking and correcting code and an entire bit string in which an error is to be corrected by the error checking and correction code, included in the same code word, are stored in both the k reception-side shift registers and the m reception-side shift registers, reads the error checking and correcting code of the code word from the m reception-side shift registers and with use of the readout-error checking and correcting code, performs error correction of the bit string in which the error is to be corrected by the error checking and correcting code stored in the k reception-side shift registers.

2. A signal transmission circuit connected with a first signal line group and a second signal line group, comprising:

a transmission-side data buffer section, comprising k transmission-side shift registers each having k stages where the number of bits of a word is k, that inputs respective bits of an input word to the k transmission-side shift registers, and outputs respective bits, output from the k transmission-side shift registers, to different signal lines of the first signal line group, respectively;

a code generation section that, each time a new word is input to the transmission-side data buffer section, generates an m-bit error checking and correcting code for correcting an error in a bit string having a total of k bits, the bit string being formed by reading 1 bit each from different stages of the k transmission-side shift registers; and a code transmission section, comprising m transmission-side shift registers each having k+m stages, that inputs respective bits of the error checking and correcting code generated by the code generation section to the m transmission-side shift registers, and outputs respective bits, output from the m transmission-side shift registers, to different signal lines of the second signal line group, respectively.

3. A signal reception circuit connected with a first signal line group and a second signal line group, comprising:

a reception-side data buffer section, comprising k reception-side shift registers each having k+m stages, that inputs respective bits of a word received from the first signal line group to the k reception-side shift registers, and outputs respective bits output from the k reception-side shift registers;

a reception-side code buffer section, comprising m reception-side shift registers each having m stages, that inputs respective bits received from the second signal line group to the m reception-side shift registers; and an error correction section that, when an entire error checking and correcting code and an entire bit string in which an error is to be corrected by the error checking and correction code, included in the same code word, are stored in both the k reception-side shift registers and the m reception-side shift registers, reads the error checking and correcting code of the code word from the m reception-side shift registers, and with use of the readout error checking and correcting code, performs error correction of the bit string in which the error is to be corrected by the error checking and correcting code stored in the k reception-side shift registers.

4. A signal transmission/reception circuit comprising a signal transmission circuit and a signal reception circuit connected with each other by a first signal line group and a second signal line group, wherein the signal transmission circuit comprises:

a transmission-side data buffer section, comprising k transmission-side shift registers each having 2k stages where the number of bits of a word is k, that inputs respective bits of an input word to the k transmission-side shift registers, and outputs respective bits, output from the k transmission-side shift registers, to different signal lines of the first signal line group, respectively;

a code generation section that, each time 2k pieces of words are input to the k transmission-side shift registers, reads the 2k pieces of words stored in the k transmission-side shift registers by dividing it into 2k pieces of k-bit bit strings in such a manner that a combination of any 2 bits in any bit string are neither a combination of bits stored in the same transmission-side shift register nor a combination of bits in the same stages of the k transmission-side shift registers, and generates 2k pieces of m-bit error checking and correcting codes for correcting errors in the readout 2k pieces of bit strings; and a code transmission section, comprising m transmission-side shift registers each having 2k stages, that each time 2k error checking and correcting codes are generated by the code generation section, stores respective bits of the 2k error checking and correcting codes in the m transmission-side shift registers in such a manner that a combination of any 2 bits in any error checking and correcting code are neither a combination of bits to be stored in the same transmission-side shift register nor a combination of bits to be stored in the same stages of the m transmission-side shift registers, and that the stages of the m transmission-side shift registers storing the respective bits of the error checking and correcting code are not the same as the stages of the k transmission-side shift registers storing the bit string in which the error is to be corrected by the error checking and correcting code, and then performs outputting of the m transmission-side shift registers in synchronization with the k transmission-side shift registers, and outputs the respective bits, output from the m transmission-side shift register, to different signal lines of the second signal line group, respectively, and the signal reception circuit includes:

a reception-side data buffer section, including k reception-side shift registers each having 2k stages, that inputs respective bits of a word received from the first signal line group to the k reception-side shift registers, and outputs respective bits output from the k reception-side shift registers;

a reception-side code buffer section, including m reception-side shift registers each having 2k stages, that inputs respective bits received from the second signal line group to the m reception-side shift registers; and an error correction section that, when entire bits of error checking and correcting codes and entire bits of bit strings in which the errors are to be corrected by the error checking and correcting codes, comprised in the 2k pieces of code words, are stored in both the k reception-side shift registers and the m reception-side shift registers, reads the error checking and correcting code of each of the code words from the m reception-side shift registers, and with use of the readout error checking and correcting code, performs error correction of the bit string in which the error is to be corrected by the error checking and correcting code of each of the code words stored in the k reception-side shift registers.

5. A signal transmission circuit connected with a first signal line group and a second signal line group, comprising:

a transmission-side data buffer section, including k transmission-side shift registers each having 2k stages where the number of bits of a word is k, that inputs respective bits of an input word to the k transmission-side shift registers, and outputs respective bits, output from the k transmission-side shift registers, to different signal lines of the first signal line group, respectively;

a code generation section that, each time 2k pieces of words are input to the k transmission-side shift registers, reads the 2k pieces of words stored in the k transmission-side shift registers by dividing it into 2k pieces of k-bit bit strings in such a manner that a combination of any 2 bits in any bit string are neither a combination of bits stored in the same transmission-side shift register nor a combination of bits in the same stages of the k transmission-side shift registers, and generates 2k pieces of m-bit error checking and correcting codes for correcting errors in the readout 2k pieces of bit strings; and a code transmission section, including m transmission-side shift registers each having 2k stages, that each time 2k pieces of error checking and correcting codes are generated by the code generation section, stores respective bits of the 2k pieces of error checking and correcting codes in the m transmission-side shift registers in such a manner that a combination of any 2 bits in any error checking and correcting code are neither a combination of bits to be stored in the same transmission-side shift register nor a combination of bits to be stored in the same stages of the m transmission-side shift registers, and that the stages of the m transmission-side shift registers storing the respective bits of the error checking and correcting code are not the same as the stages of the k transmission-side shift registers storing the bit string in which the error is to be corrected by the error checking and correcting code, and then performs outputting of the m transmission-side shift registers in synchronization with the k transmission-side shift registers, and outputs the respective bits, output from the m transmission-side shift registers, to different signal lines of the second signal line group, respectively.

6. A signal reception circuit connected with a first signal line group and a second signal line group, comprising:

a reception-side data buffer section, including k reception-side shift registers each having 2k stages, that inputs respective bits of a word received from the first signal line group to the k reception-side shift registers, and outputs respective bits output from the k reception-side shift registers;

a reception-side code buffer section, including m reception-side shift registers each having 2k stages, that inputs respective bits received from the second signal line group to the m reception-side shift registers; and an error correction section that, when entire bits of error checking and correcting codes and entire bits of bit strings in which the errors are to be corrected by the error checking and correcting codes, included in the 2k pieces of code words, are stored in both the k reception-side shift registers and the m reception-side shift registers, reads the error checking and correcting code of each of the code words from the m reception-side shift registers, and with use of the readout error checking and correcting code, performs error correction of the bit string in which the error is to be corrected by the error checking and correcting code of each of the code words stored in the k reception-side shift registers.

\* \* \* \* \*